United States Patent
Wilson et al.

[11] Patent Number: 5,822,237
[45] Date of Patent: Oct. 13, 1998

[54] VOLTAGE REFERENCE FOR A FERROELECTRIC 1T/1C BASED MEMORY

[75] Inventors: Dennis R. Wilson, Black Forest; H. Brett Meadows, Colorado Springs, both of Colo.

[73] Assignee: Ramtron International Corporation, Colorado Springs, Colo.

[21] Appl. No.: 634,445

[22] Filed: Apr. 18, 1996

Related U.S. Application Data

[62] Division of Ser. No. 306,686, Sep. 16, 1994, Pat. No. 5,572,459.

[51] Int. Cl.⁶ .................................................. G11C 11/22
[52] U.S. Cl. .................... 365/145; 365/189.09; 365/205; 365/204
[58] Field of Search .................................... 365/145, 149, 365/189.09, 205, 204

[56] References Cited

U.S. PATENT DOCUMENTS

| | | | |
|---|---|---|---|
| 5,381,364 | 1/1995 | Chern et al. | 365/145 |
| 5,424,975 | 6/1995 | Lowrey et al. | 365/145 |
| 5,432,731 | 7/1995 | Kirsh et al. | 365/145 |
| 5,517,445 | 5/1996 | Imai et al. | 365/145 |
| 5,572,459 | 11/1996 | Wilson et al. | 365/145 |
| 5,598,366 | 1/1997 | Kraus et al. | 365/145 |
| 5,621,680 | 4/1997 | Newman et al. | 365/145 |

FOREIGN PATENT DOCUMENTS

| | | |
|---|---|---|
| 0 365 002 A3 | 4/1990 | European Pat. Off. |
| 6232361 | 8/1994 | Japan . |
| 7093978 | 4/1995 | Japan . |

*Primary Examiner*—Viet Q. Nguyen
*Attorney, Agent, or Firm*—Peter J. Meza, Esq.

[57] ABSTRACT

A reference cell for a 1T-1C memory is disclosed for use in either an open or folded memory cell array. Each reference cell has two outputs each coupled to a bit line that each develop a voltage substantially half of that developed by a ferroelectric memory cell. The reference voltages and memory cell voltage are than resolved by a sense amplifier. Each reference cell includes two ferroelectric capacitors that are the same size and fabricated with the identical process as the memory cell ferroelectric capacitors. Any changes in the memory cell capacitor similarly affects the reference cell capacitor, and thus the reference voltage is always substantially half of that developed by the memory cell. The reference cells include a number of timing inputs, which control charge sharing and configure the cell to operate in either a DRAM or FRAM® mode. In a first embodiment, one of the reference cell capacitors is poled. In a second embodiment, the reference cell capacitors are not poled and maintain the same polarization state, thus reducing fatigue.

8 Claims, 15 Drawing Sheets

VOLTAGE REFERENCE FOR A FERROELECTRIC 1T/1C BASED MEMORY

This application is a division of application Ser. No. 08/306,686 Sep. 16, 1994 which is now patented as U.S. Pat. No. 5,572,459.

BACKGROUND OF THE INVENTION

This invention relates generally to ferroelectric memory cells and arrays of such cells and, more particularly, to a voltage reference for a shared sense amplifier arrangement for a one transistor, one capacitor ("1T-1C") ferroelectric memory.

In a conventional integrated circuit memory, digital data is stored in a matrix of memory cells. A large number of memory cells are typically arranged in rows and columns, and are accessed by the memory's bit and word lines. A number of reference or dummy cells are usually included in the memory, arranged in a column, and are used to generate a reference voltage. Reference or dummy cells are only needed for certain memory cells, such as 1T-1C memory cells, that are not self-referenced. The reference voltage is compared to the generated voltage of an addressed column of memory cells by a sense amplifier in order to generate valid logic levels. Usually, the reference voltage is designed to have a value halfway between the voltages generated by the charge in a memory cell representing a logic zero and a logic one.

An array 10 of memory cells 12 is shown in FIG. 1, the arrangement of memory cells being designated an "open architecture", wherein the arrangement of memory cells 12 and reference cells 14 generally corresponds to their placement on an integrated circuit layout. In the open architecture, a first half 10a of the memory array includes memory cells 12 arranged in rows and columns located at each of the intersections of word lines $W_0$ through $W_N$ and bit lines $Bit_0$ through $Bit_N$. A column of reference cells 14 are also included in the first half 10a of the memory array, and are addressed through the Ref word line. A second half 10b of the memory array includes memory cells 12 arranged in rows and columns located at each of the intersections of word lines $W_{N+1}$ through $W_{2N+1}$, and complementary bit lines $/Bit_0$ through $/Bit_N$. A column of reference cells 14 are also included in the second half 10b of the memory array, and are addressed through the complementary /Ref word line. Note in array 10 that for each addressed memory cell 12, there is a corresponding single output reference cell 14. A column of sense amplifiers designated $SA_0$ through $SA_N$ is placed between the two halves of memory array 10. Each of the sense amplifiers has a first input coupled to one of the bit lines in the first half 10a of the array, and a second input coupled to one of the complementary bit lines in the second half 10b of the array. (The outputs of the sense amplifiers and other architecture structure are not shown in FIG. 1 for clarity.) The sense amplifiers resolve into valid logic levels the voltage developed by the reference cells 14 in the first half 10a of array 10 with an addressed column of memory cells 12 in the second half 10b of array 10. Conversely, the sense amplifiers also resolve into valid logic levels the voltage developed by the reference cells 14 in the second half 10b of array 10 with an addressed column of memory cells 12 in the first half 10a of array 10.

The benefit of an open architecture such as that shown in FIG. 1 is that the memory cells 12 can be tightly packed in an integrated circuit layout, as each intersection of a word and bit line includes a memory cell 12. One disadvantage of the open architecture is that signal from one column of memory cells 12 can be capacitively coupled to another column of memory cells either through wiring capacitance or junction capacitance of the substrate. This is particularly true, for example, if all of the memory cells 12 in all columns except one are latched to a logic one, whereas the memory cells 12 in a remaining column are latched to a logic zero. The capacitive coupling of signal to the remaining column may be sufficient to cause errors in the latched data. The open architecture is thus prone to noise problems that can degrade performance.

An alternative array 20 of memory cells 12 is shown in FIG. 2, the arrangement of memory cells being designated a "folded architecture", wherein the arrangement of memory cells 12 and reference cells 14 again generally correspond to their placement on an integrated circuit layout. In the folded architecture, a single memory array 20 includes memory cells 12 arranged in rows and columns located at each of the intersections of word lines $W_0$ through $W_N$ and complementary bit line pairs $Bit_0$, $/Bit_0$ through $Bit_N$, $/Bit_N$. Two columns of reference cells 14 are also included in the single array, and are addressed through the Ref and /Ref word lines. Note that a first column of reference cells 14 addressed by the Ref word line is associated with $Bit_0$ through $Bit_N$ bit lines, and a second column of reference cells 14 addressed by the /Ref word line is associated with the complementary $/Bit_0$ through $/Bit_N$ bit lines. Note also in array 20 that for each addressed memory cell 12, there is a corresponding single output reference cell 14. A column of sense amplifiers designated $SA_0$ through $SA_N$ is placed at one end of memory array 20. Each of the sense amplifiers has a first input coupled to one of the bit lines in a bit line pair, and a second input is coupled to the other of the bit lines in the bit line pair. (The outputs of the sense amplifiers and other architecture structure are also not shown in FIG. 2 for clarity.) The sense amplifiers resolve into valid logic levels the voltage developed by the first column of reference cells 12 with an addressed column of memory cells 14 having an even word line number. Conversely, the sense amplifiers also resolve into valid logic levels the voltage developed by the second column of reference cells 14 with an addressed column of memory cells 12 having an odd word line number.

The benefit of a folded architecture such as that shown in FIG. 2 is that every other column of memory cells 12 contains complementary data and therefore the capacitive coupling and resultant noise problems are diminished. However, the memory cells 14 cannot be as tightly packed in an integrated circuit layout. Note now that each intersection of a word and bit line does not necessarily include a memory cell 12. A memory cell 12 is missing from every other intersection. The folded architecture is thus generally superior to the open architecture from a circuit performance standpoint, but is more difficult to lay out and consumes more integrated circuit die area.

Turning now to FIG. 3A a two-transistor, two capacitor ("2T-2C") ferroelectric memory cell 30 is shown including transistors M1 and M2, and ferroelectric capacitors C1 and C2. Memory cell 30 is addressed by a word line 36, complementary bit lines 32 and 34, and, unlike conventional DRAM memories, an active plate line 38. Also unlike conventional DRAM memories, memory cell 30 is non-volatile, because the data state of the memory is stored as stable complementary "polarization vectors" in capacitors C1 and C2, and not as charge that must be refreshed to maintain the cell data state. Polarization vectors are defined and described in further detail below with respect to FIGS. 3B, 4A, and 4B. The operation of a 2T-2C ferroelectric memory cell is described in further detail in U.S. Pat. No. 4,873,664 entitled "Self Restoring Ferroelectric Memory" to Eaton, Jr., which is hereby incorporated by reference. In particular, refer to FIG. 4 of Eaton, Jr. and the accompanying description. Memory cell 30 is complementary and self-referenced in that the cell state is determined by comparing the polarization vector of capacitor C1 to the polarization vector of capacitor C2. Memory cell 30 can be arranged into a matrix of columns and rows without separate reference cells. Reading from and writing to memory cell 30 are accomplished preferably by applying a pulse on plate line 38.

Ferroelectric capacitors C1 and C2 are shown separately in FIG. 3B with a corresponding polarization vector arrow, which indicates the direction of polarization of the ferroelectric dielectric in the capacitor. A voltage that is greater than a material-related "coercive voltage" polarizes a substantial number of atoms within the crystal structure of the ferroelectric dielectric material to one of two stable locations within a unit cell. The polarization of the ferroelectric capacitor remains once the voltage is removed. By convention, capacitor C1 is deemed to have an "up" polarization vector, because a voltage greater than the coercive voltage is applied to the capacitor so that the "bottom plate" of the capacitor, which is at five volts, is more positive than the "top plate" of the capacitor, which is at zero volts. The "top" and "bottom" conventions refer to the physical location of the capacitor plates in the schematic diagram of FIG. 3B. The top and bottom plates of the capacitors may not necessarily correspond to the physical location in the fabricated integrated circuit memory. Also, by convention, capacitor C2 is deemed to have a "down" polarization vector, because a voltage greater than the coercive voltage is applied to the capacitor so that the "top plate" of the capacitor, which is at five volts, is more positive than the "bottom plate" of the capacitor, which is at zero volts. The complementary polarization vectors shown in FIG. 3B would actually represent one bit of data in memory cell 30, which can be arbitrarily assigned either to a logic one or logic zero data state.

The operation of ferroelectric capacitors such as those found in memory cell 30 is further described with reference to the hysteresis figure 40 and corresponding voltage diagram shown in FIGS. 4A and 4B. FIG. 4A is a plot of the voltage versus charge or polarization behavior of a ferroelectric capacitor. While reference may be made to "charge" in the dielectric of the ferroelectric capacitor, it should be noted that the capacitor charge dissipates, i.e. is volatile. However hysteresis curve 40 also represents polarization, which is non-volatile. Reference is made to both aspects of charge and polarization, which generally correspond before the charge on the capacitor dissipates. Various ferroelectric materials are known in the art, such as phase III potassium nitrate, bismuth titanate and the PZT family of lead zirconate and titanate compounds, among others. Given the current state of the art, the preferred ferroelectric material is PZT. One characteristic of such ferroelectric materials is a hysteresis curve or loop 40 as shown in FIG. 4A, wherein the x-axis represents the field voltage applied to the material and the y-axis represents the polarization vector (or charge) of the ferroelectric material. The flow of current through a ferroelectric capacitor depends on the prior history of the applied voltages. A voltage waveform 47 is shown in FIG. 4B that includes two positive voltage pulses and two negative voltage pulses that are applied to one electrode of a ferroelectric capacitor in a Sawyer tower circuit arrangement, which is explained in further detail below with reference to FIG. 4C. The exact timing of the pulses is arbitrary, and can include extremely long pulse widths. Circled point numbers one through six on hysteresis curve 40 correspond to the same circled point numbers on the voltage diagram of FIG. 4B.

Turning momentarily to FIG. 4C, a Sawyer tower circuit is shown having a ferroelectric capacitor 48 in series with a conventional load capacitor 49. The size of load capacitor 49 is made large with respect to the size of ferroelectric capacitor 48 so that most of the input voltage, $V_{IN}$, supplied by waveform 47, is dropped across ferroelectric capacitor 48. The output voltage, $V_{OUT}$, provided by the Sawyer tower circuit, is the characteristic hysteresis curve 40 typical of certain ferroelectric materials.

Starting at a first point 41 on both the hysteresis FIG. 40 and the voltage diagram of FIG. 4B (which also corresponds to circled point number one), there is no externally-applied voltage across the ferroelectric capacitor, but there was previously an applied voltage across the ferroelectric material that left the material polarized at point 41. Applying a positive voltage across the ferroelectric material moves the operating point (i.e., the current polarization) along the hysteresis curve 40 to a second point 42. The change in polarization vector or charge is designated "P" and is labeled on the rising edge of the first voltage pulse shown in FIG. 4B and on the hysteresis curve 40 shown in FIG. 4A. The charge liberated with the change in polarization vector is referred to as the "switched charge." Next, the trailing edge of the first pulse in FIG. 4B occurs between circled numbers 2 and 3. This is typically a return-to-zero transition in the externally applied voltage. Removing such positive voltage moves the polarization along the hysteresis curve to a third point 43. The direction component of spontaneous remnant polarization within the ferroelectric material is unchanged, although there is some loss of field induced polarization, i.e. a loss in the polarization magnitude in a non-ideal ferroelectric material. The change in charge is designated "$P_a$" and is labeled on the falling edge of the first voltage pulse shown in FIG. 4B and on the hysteresis curve 40 shown in FIG. 4A. Circled point 3 is at zero externally-applied volts and, while at zero on the horizontal (voltage) axis, has a non-zero vertical component. Ideally, this remnant polarization ought to remain indefinitely. However, in practice some relaxation may occur. This is shown in FIG. 4A. Specifically, between the third and fourth points 43 and 44 on the hysteresis curve 40, there is a "relaxation" of domains within the ferroelectric material resulting in a partial loss of polarization magnitude.

Applying a second positive voltage across the ferroelectric dielectric material moves the operating point from the fourth point 44 on the curve 40 back to the second point 42. The increase in charge is now labeled "U" and is less than the P increase produced by the first positive voltage. Removing the applied positive voltage moves the operating point to the fifth point 45 on the hysteresis curve 40, with a corresponding loss of charge labeled "$U_a$".

Applying a negative voltage across the ferroelectric dielectric material at the fifth point 45 on the hysteresis curve 40 moves the operating point to a sixth point 46. The change in charge and polarization is labeled "N" and is shown on the leading edge of the first negative pulse in FIG. 4B. The negative voltage reverses the polarization direction of the capacitor, resulting in the original polarization direction. Since the hysteresis curve is substantially symmetrical, removing and reapplying the negative voltage moves the operating point around the "bottom" portion of the hysteresis curve in the same manner as described above. The associated changes in charge around the loop 40 are consecutively labeled "N", "$N_a$", "D" and "$D_a$" in FIG. 4B. Note that the relaxation of the loop is not shown in the bottom portion of loop 40, though it exists in a non-ideal ferroelectric material, and therefore the charge components labeled "$N_a$", "D" and "$D_a$" are assumed to all be approximately equal. After the two negative voltage pulses are applied and returned to zero applied volts, the operating point is returned to the first point 41 on the hysteresis curve 40.

Turning now to FIG. 5, a 1T-1C ferroelectric memory cell 52a and array 50 are shown. FIG. 5 corresponds generally to FIG. 3 of the Eaton, Jr., patent referred to above. Ferroelectric memory cell 52a includes a single MOS transistor 56 and a single ferroelectric capacitor 58. Memory cell 52a is coupled to a bit line 66, a word line 70 and a plate line 72. Array 50 includes many other memory cells, of which representative cells 52b and 52c coupled to bit line 66, and cells 52d and 52e coupled to a complementary bit line 68, are shown. The plate and word lines have been omitted from these cells for clarity. In array 50, a "dummy" cell 54a is used, in conjunction with sense amplifier 64, to resolve the data state of an addressed memory cell such as memory cell 52a. The dummy cell includes a transistor 60 and a ferroelectric capacitor 62 in the same configuration as memory cell 52a. Similarly, a dummy cell 54b on the other side of sense amplifier 64 is used to resolve the data states of memory cells 52d and 52e. Ferroelectric capacitor 62 in memory cell 54a is sized to be about twice as large as the capacitor 58 in memory cell 52a. Also, capacitor 62 always stores the polarization representative of a logic zero. If memory cell 52a also contains a logic zero, when poled, capacitor 58 will not move as much charge for the same voltage as capacitor 62, which has twice as much capacitance, and therefore complementary bit line 68 will be driven high and bit line 66 will be driven low. If memory cell 52a contains a logic one, when poled, capacitor 58 will change polarization states, liberating a large amount of charge that is greater than the amount of charge moved by capacitor 62. Consequently bit line 66 will be driven high and complementary bit line 68 will be driven low.

Although the 2T-2C memory cell of FIG. 3A is self-referenced and requires no separate reference or dummy cells, one problem with such a cell and corresponding array is that it consumes roughly twice as much area as a 1T-1C memory array to store the same number of bits. The 1T-1C memory array of FIG. 5, while solving this problem, is difficult to manufacture as an integrated circuit. One problem is that the two-to-one ratio of the dummy cell capacitor size to a memory cell capacitor size is hard to maintain from chip to chip and from one manufacturing run to another. Another problem is that there is an inherent imbalance in the bit lines coupled to the sense amplifier 64. In 1T-1C ferroelectric memory arrays, the bit line capacitance is used to sense the charge of the coupled memory cell. In a dummy cell arrangement, one bit line is coupled to one unit of capacitance in the memory cell, whereas the complementary bit line is coupled to two units of capacitance in the dummy cell. This capacitor imbalance results in lower sensitivity in the sense amplifiers and may even result in the wrong logic signal being latched by the sense amplifier.

What is desired, therefore, is a voltage reference in a balanced array configuration for a 1T-1C ferroelectric memory that is easily manufacturable on an integrated circuit with minimum die size.

SUMMARY OF THE INVENTION

It is, therefore, a principal object of the present invention to provide a reference cell for a 1T-1C ferroelectric memory array.

An advantage of a reference cell according to the invention is its ease of manufacture on an integrated circuit, and with minimum die size.

It is a further advantage of the invention that reference voltage tracks the voltage produced by the switched charge of a ferroelectric memory cell.

It is a further advantage of the invention that the reference cell can be used in both dynamic ("DRAM") and non-volatile ferroelectric ("FRAM®") modes.

According to the present invention, a reference cell for a 1T-1C memory is disclosed for use in either an open or folded memory cell array. Each reference cell has two outputs each coupled to a bit line that each develop a voltage substantially half of that developed by a ferroelectric memory cell. The reference voltages and memory cell voltage are subsequently resolved by a sense amplifier. Each reference cell includes two ferroelectric capacitors that are not only the same size as, but also fabricated with the identical process as the memory cell ferroelectric capacitors. Any changes affecting the memory cell capacitor similarly affect the reference cell capacitor, and thus the reference voltage is always substantially half of that developed by the memory cell. The reference cells include a number of timing inputs, which control charge sharing and configure the cell to operate in either a DRAM or FRAM® mode. In a first embodiment, one of the reference cell capacitors is poled. In a second embodiment, the reference cell capacitors are not poled and maintain the same polarization state, thus reducing fatigue.

The foregoing and other objects, features and advantages of the invention will become more readily apparent from the following detailed description of a preferred embodiment of the invention which proceeds with reference to the accompanying drawings.

DETAILED DESCRIPTION

Figure 1:
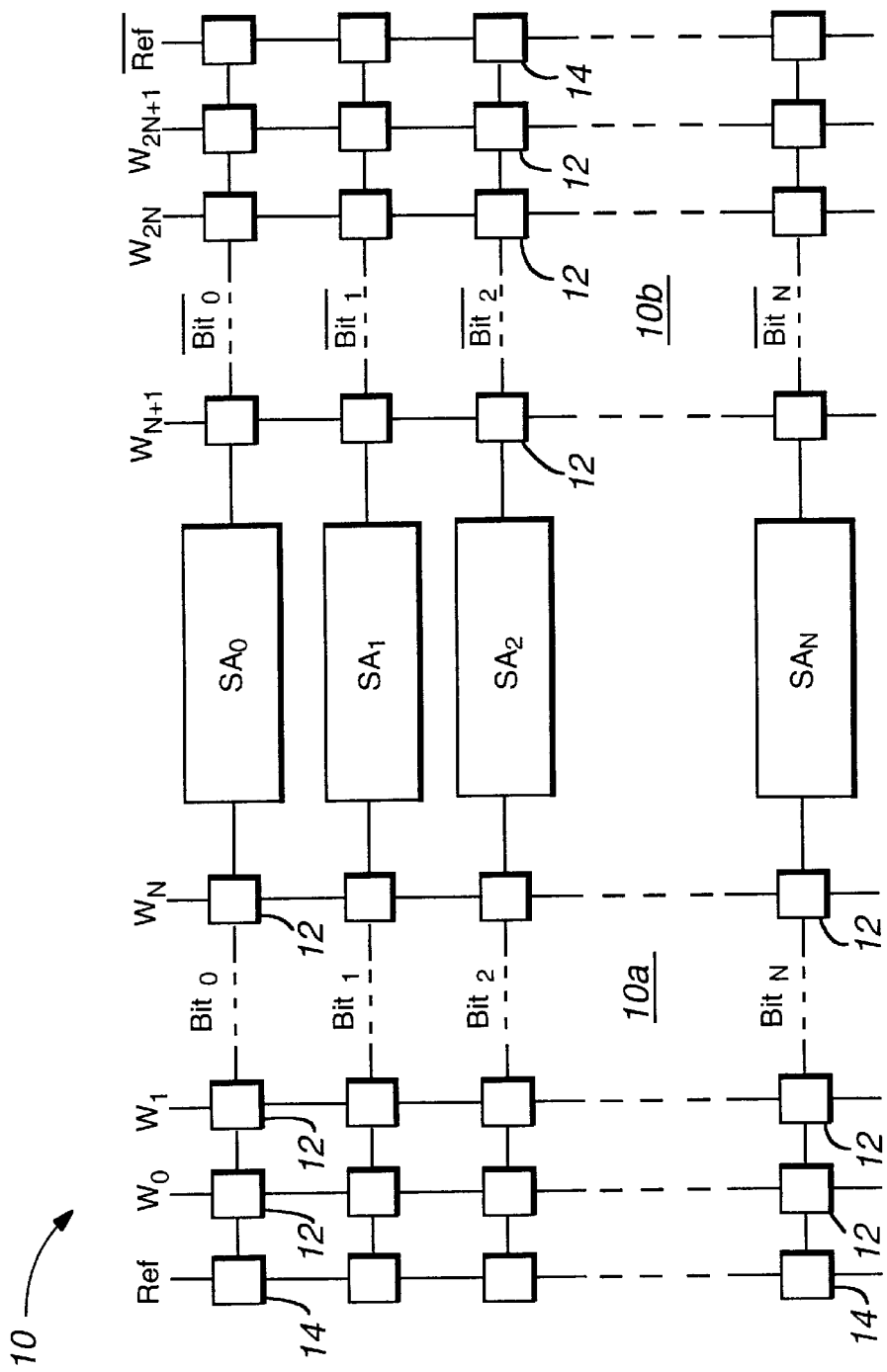
FIG. 1 is a schematic diagram of a prior art open memory array architecture.
Figure 6:
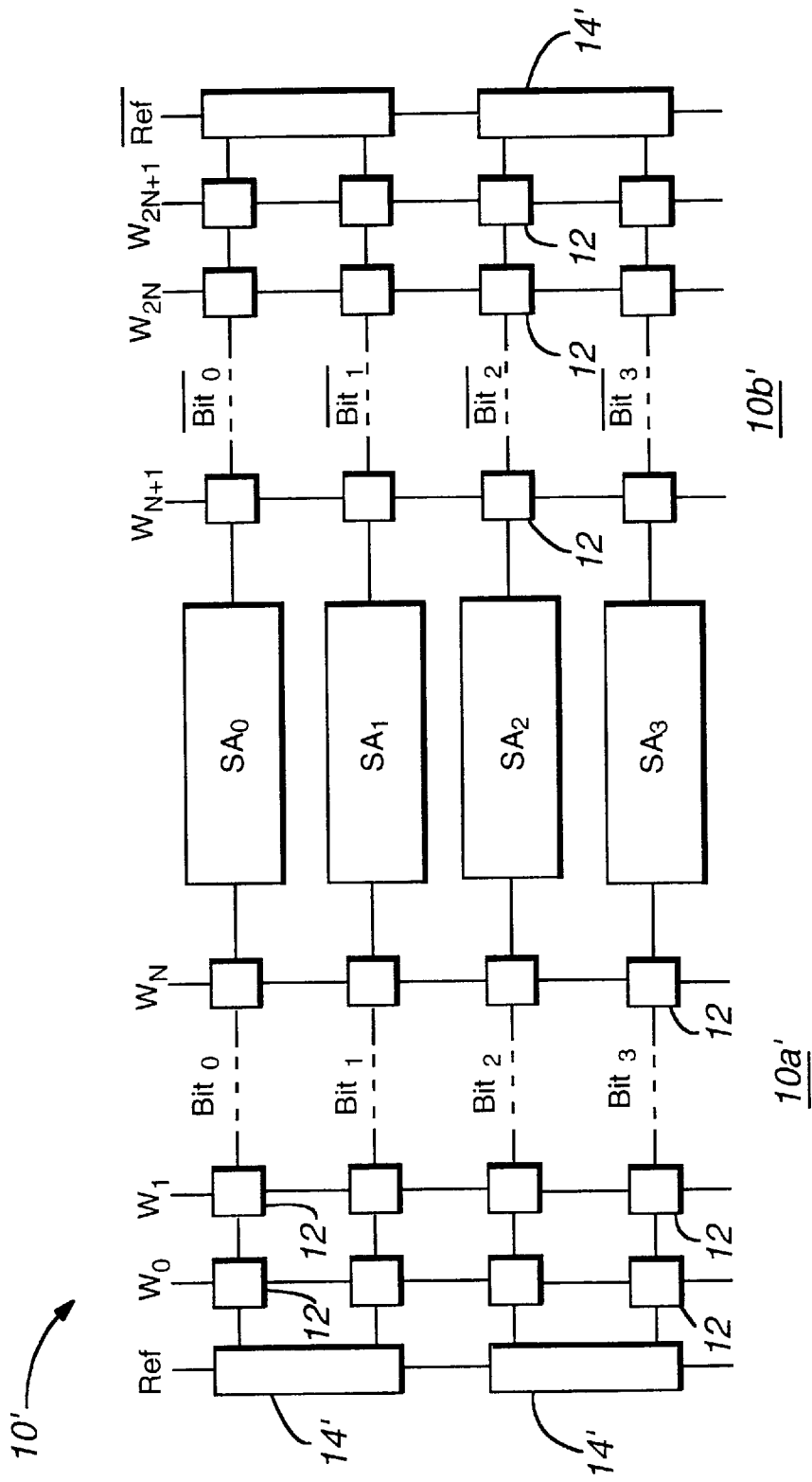
FIG. 6 is a schematic diagram of an open memory array architecture according to the present invention.

Referring now to FIG. 6, an open architecture array 10' of memory cells 12 is shown, which has been modified according to the present invention. Each memory cell 12, therefore, may illustratively comprise a ferroelectric capacitor and transistor connected in series between a plate line and a bit line. In the open architecture, a first half 10a' of the memory array includes memory cells 12 arranged in rows and columns located at each of the intersections of word lines $W_0$ through $W_N$ and bit lines $Bit_0$ through $Bit_3$. (Only the first four bit lines are shown in FIG. 6) A column of dual output reference cells 14' is also included in the first half 10a' of the memory array, and they are addressed through a Ref word line. A second half 10b' of the memory array includes memory cells 12 arranged in rows and columns located at each of the intersections of word lines $W_{N+1}$ through $W_{2N+1}$, and complementary bit lines $/Bit_0$ through $/Bit_3$. A column of dual output reference cells 14' is also included in the second half 10b' of the memory array, and are addressed through a complementary /Ref word line. The structure and operation of dual output reference cells 14' are discussed in greater detail below. Note in array 10' that for each dual output reference cell 14', there are two corresponding rows of memory cells 12. Since these are addressed by word lines, each reference cell 14' will correspond to two so addressed memory cells 12. A column of sense amplifiers designated $SA_0$ through $SA_3$ is placed between the two halves of memory array 10', which operate in a similar fashion to that described with reference to FIG. 1.

Figure 2:
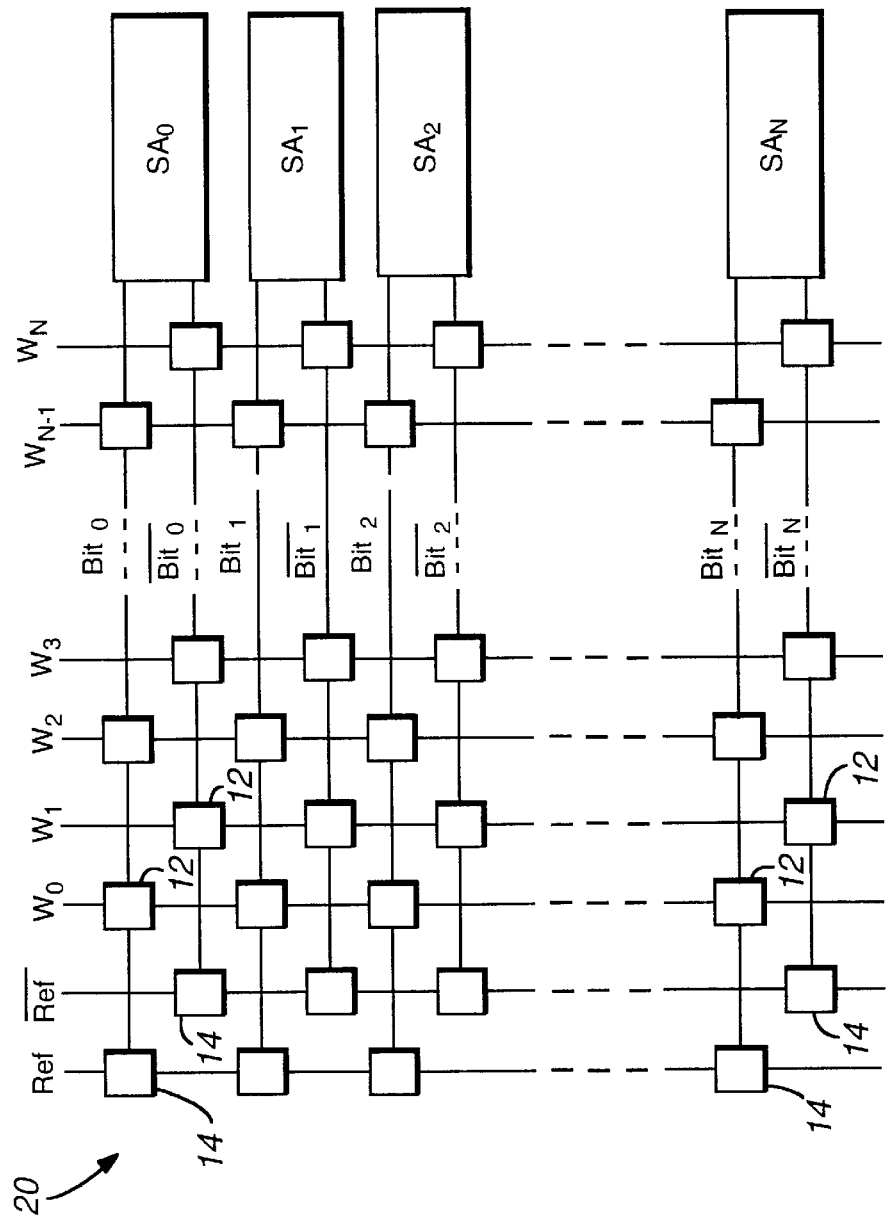
FIG. 2 is a schematic diagram of a prior art folded memory array architecture.
Figure 3A:
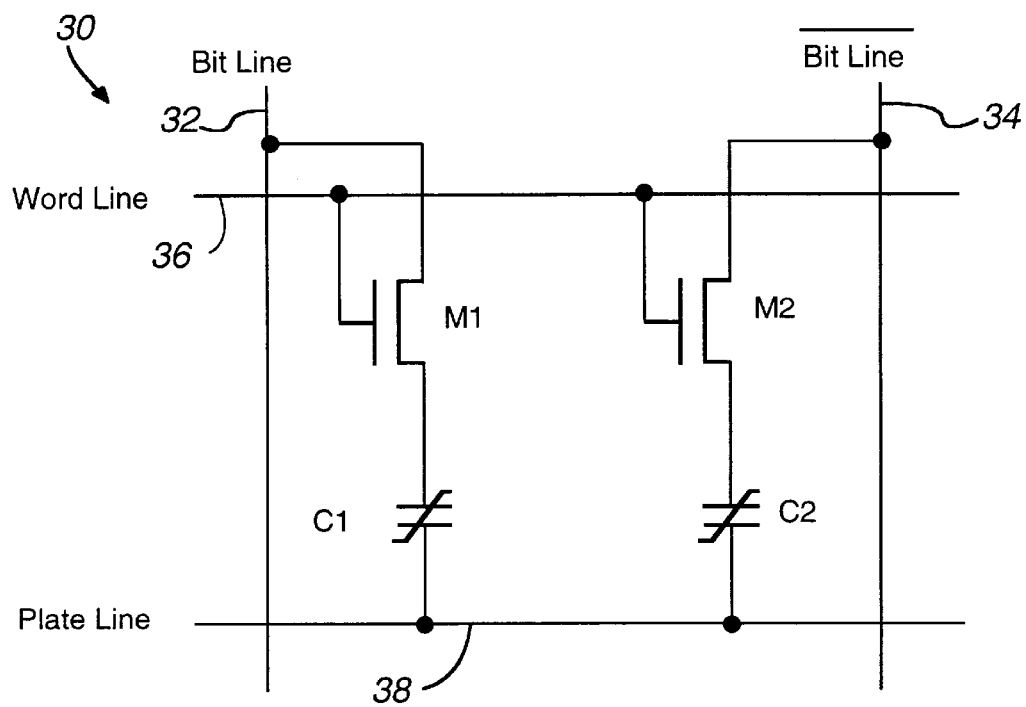
FIG. 3A is a schematic diagram of a prior art 2T-2C ferroelectric memory cell.
Figure 3B:
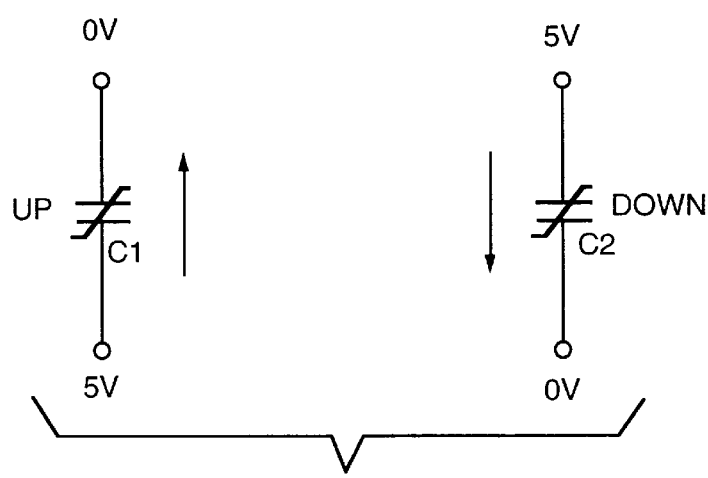
FIG. 3B is a schematic diagram of two ferroelectric capacitors shown with their corresponding polarization vector arrows, which illustrates the polarization convention used throughout the specification.
Figure 7:
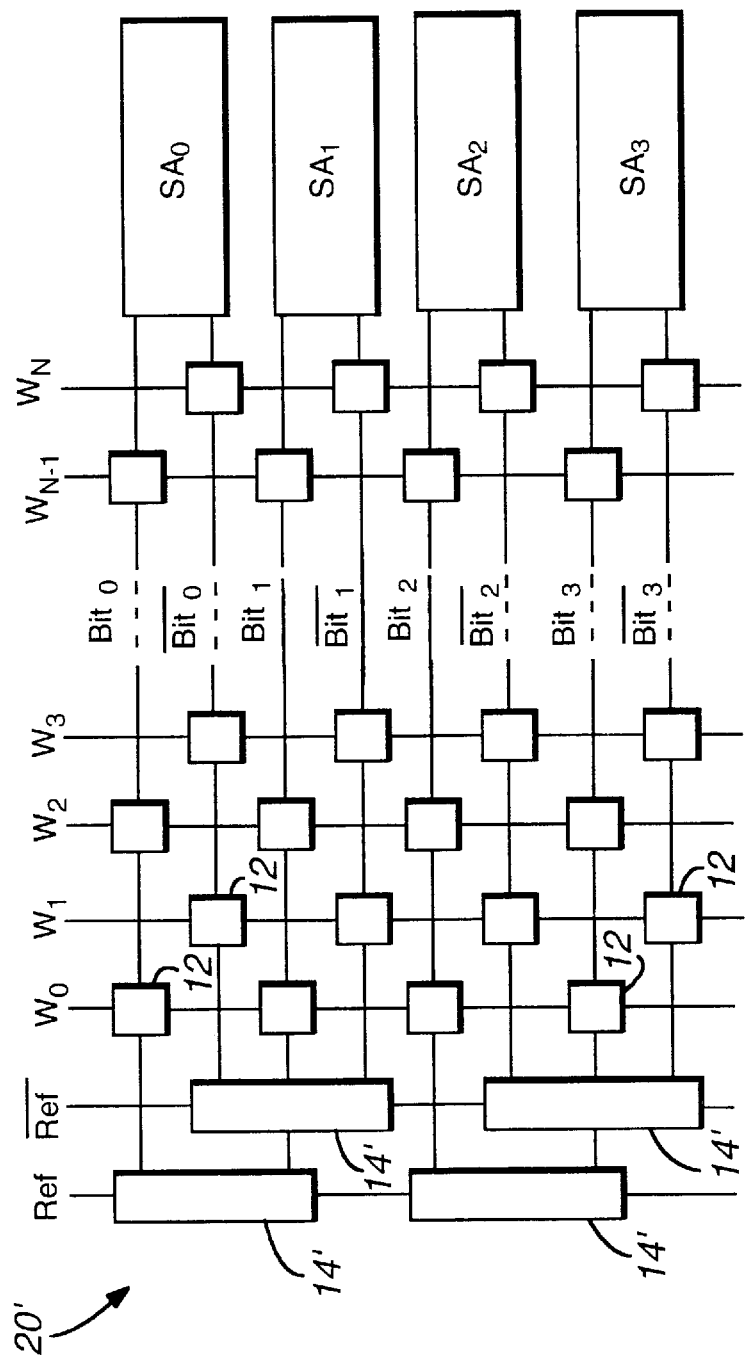
FIG. 7 is a schematic diagram of a folded memory array architecture according to the present invention.

Referring now to FIG. 7, a folded architecture array 20' of memory cells 12 is shown, which has been modified according to the present invention. In the folded architecture, a single memory array 20' includes memory cells 12 arranged in rows and columns located at each of the intersections of word lines $W_0$ through $W_N$ and complementary bit line pairs $Bit_0$, $/Bit_0$ through $Bit_3$, $/Bit_3$. (Again, only the first four bit lines are shown in FIG. 7) Two columns of dual output reference cells 14' are also included in the single array, and are addressed through the Ref and /Ref word lines. Note that the first column of reference cells 14' addressed by the Ref word line is associated with the $Bit_0$, $Bit_1$, $Bit_2$ and $Bit_3$ bit lines, wherein each reference cell 14' provides a reference voltage for a corresponding pair of bit lines, i.e. $Bit_0$ is paired with $Bit_1$, and $Bit_2$ is paired with $Bit_3$. Likewise, a second column of reference cells 14' addressed by the /Ref word line is associated with the complementary $/Bit_0$, $/Bit_1$, $/Bit_2$ and $/Bit_3$ bit lines, wherein each reference cell 14' provides a reference voltage for a corresponding pair of bit lines—$/Bit_0$ with $/Bit_1$, and $/Bit_2$ with $/Bit_3$. Note also in array 20' that for each dual output reference cell 14', there are two corresponding rows and hence there will be two corresponding addressed memory cells 12. A column of sense amplifiers designated $SA_0$ through $SA_3$ is placed at the termination of the bit lines of memory array 20', which operate in a similar fashion to that described with reference to FIG. 2.

Figure 8:
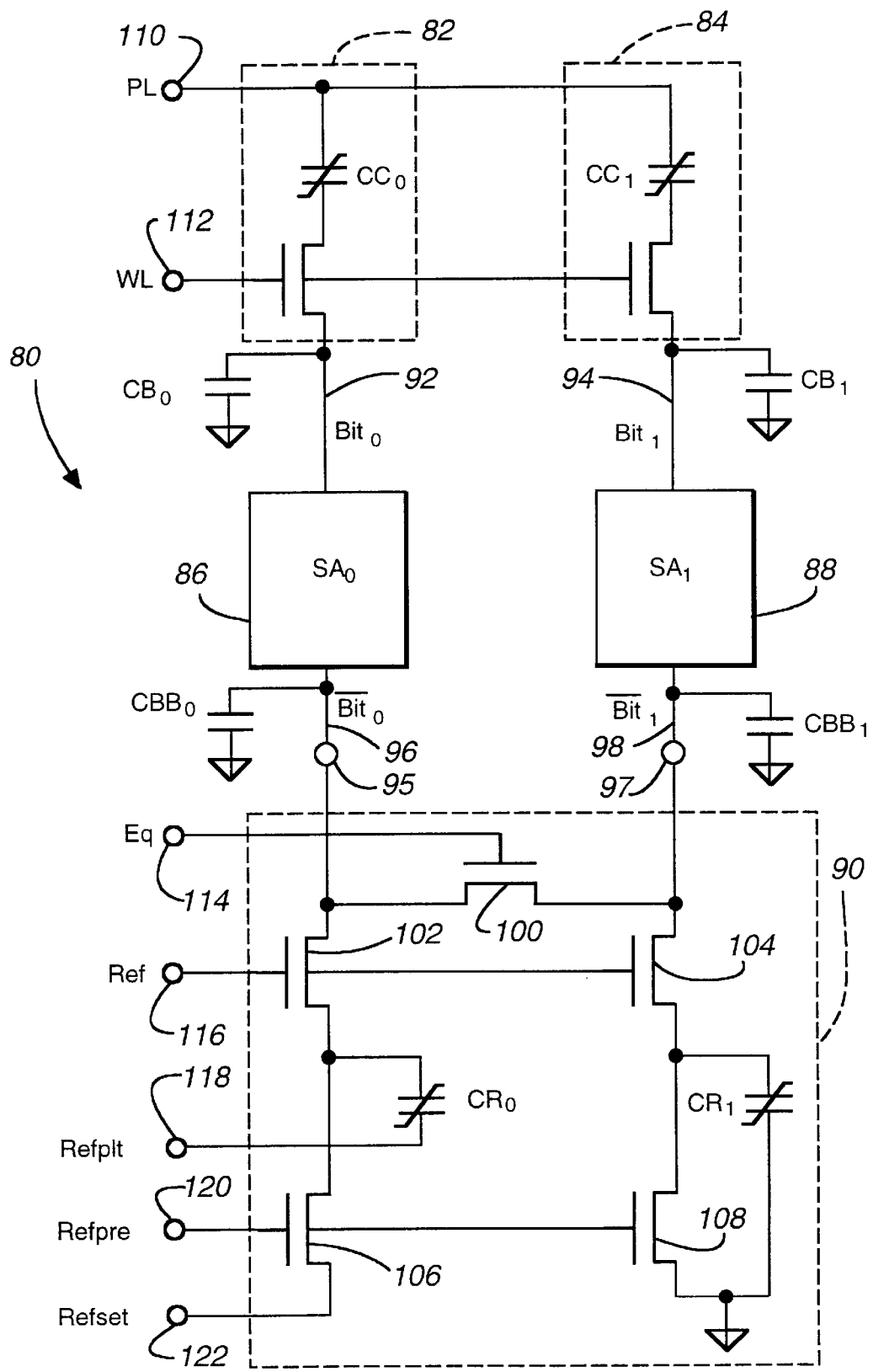
FIG. 8 is a schematic diagram of a first embodiment of a ferroelectric reference cell according to the present invention.

A first embodiment of reference cell 14' is a cell 90 for use in a ferroelectric memory including an array of 1T-1C memory cells. Reference cell 90 is shown in FIG. 8. In addition to reference cell 90, a portion of an array 80 is shown including two representative 1T-1C memory cells 82 and 84, as well as sense amplifiers 86 and 88 labeled $SA_0$ and $SA_1$. Memory cells 82 and 84 are coupled to a common plate line 110 labeled PL, a common word line 112 labeled WL, and to bit lines 92 and 94. Preferably, plate line PL is common to all memory cells along a row, each row having its own plate line. Thus, as mentioned above, the memory will have a plurality of such plate lines PL. Array portion 80 in FIG. 8 is shown in an open architecture configuration, but this is solely for clarity in the drawing figure. Reference cell 90 can be used in either the open or folded memory architectures as shown in FIGS. 6 and 7. The bit lines 92 and 94 in FIG. 8 are labeled $Bit_0$ and $Bit_1$, with corresponding bit line capacitance loads $CB_0$ and $CB_1$. FIG. 8 also shows complementary bit lines 96 and 98 labeled $/Bit_0$ and $/Bit_1$, with corresponding bit line capacitance loads $CBB_0$ and $CBB_1$. The bit line load capacitance is primarily the inherent parasitic capacitance of the bit lines themselves, but additional discrete load capacitance can be added if desired. In FIG. 8, reference cell 90 is shown on one side (the complementary side) of the sense amplifiers. It will be understood, however, that each pair of bit lines 92, 94 and 96, 98 has a corresponding reference cell, and the reference cell for bit lines 96, 98 is not shown in FIG. 8.

Reference cell 90 includes first and second voltage reference outputs 95 and 97 coupled to respective bit lines 96 and 98. Reference cell 90 also includes first and second ferroelectric capacitors $CR_0$ and $CR_1$. The capacitance value of each of ferroelectric capacitors $CR_0$ and $CR_1$ is equal to the capacitance value of a memory cell capacitor in memory cells 82 and 84, as well as all other memory cell transistors in the array. Transistors 102 and 104 are used for selectively coupling ferroelectric capacitors $CR_0$ and $CR_1$ to the first and second voltage reference outputs 95 and 97. The gates (i.e. gate electrodes) of transistors 102 and 104 are coupled together and to a node 116 for receiving a Ref word line signal. One end (the top plate electrode) of capacitor $CR_0$ is coupled to the source of transistor 102, and the other end (the bottom plate electrode) of capacitor $CR_0$ is coupled to a node 118 for receiving a Refplt control signal. One end (the top plate electrode) of capacitor $CR_1$ is coupled to the source of transistor 104, but the other end (the bottom plate electrode) of capacitor $CR_1$ is coupled to ground. A transistor 106 is coupled between the source of transistor 102 and a node 122 to receive a Refset control signal. Hence, a Refset control signal can be coupled selectively to the top electrode of capacitor $CR_0$ via transistor 106. The gate of transistor 106 is coupled to a node 120 for receiving a Refpre control signal. Hence, a Refset control voltage can be coupled selectively to the top electrode of capacitor $CR_0$ via transistor 106. A transistor 108 is coupled between the source of transistor 104 and ground. The gate of transistor 108 is coupled to node 120 for receiving the Refpre control signal. Thus, the top electrode of capacitor $CR_1$ can be coupled selectively to ground. A transistor 100 is coupled between the reference outputs 95 and 97 and its gate is coupled to a node 114 for receiving an Eq control signal.

In general, the method of operation of dual output reference cell 90 includes either a first "non-volatile" mode or a second "volatile" mode, which can be selected by the user. In the first non-volatile mode, ferroelectric capacitor $CR_0$ is "poled" to establish a charge. The resulting reference voltage is substantially half of the voltage generated by a memory cell such as memory cell 82 or 84 when reading a logic one in a non-volatile mode, i.e. the data states correspond to the polarization states of the ferroelectric capacitors in the memory cells. In a second dynamic mode, a voltage is written onto capacitor $CR_0$ to establish a charge. The resulting reference voltage is substantially half of the voltage generated by a memory cell 82 or 84 reading a logic one in a dynamic mode, i.e. the data states correspond to the amount of charge on the ferroelectric capacitors in the memory cells. Both operational modes of reference cell 90 are described in further detail below with reference to the hysteresis loop 40 of FIG. 4A and the timing diagrams of FIGS. 9 and 10.

Non-Volatile Mode of Reference Cell 90

In general, the non-volatile mode of reference cell 90 includes the following steps: establishing a polarization vector on capacitor $CR_0$, removing any of the charge associated with capacitor $CR_0$, coupling the reference cell capacitors $CR_0$ and $CR_1$ to the respective bit lines 96 and 98, poling capacitor $CR_0$ to establish a known amount of charge, and finally distributing the known charge between reference cell capacitors $CR_0$ and $CR_1$ to create a reference voltage that is impressed on both bit lines 96 and 98.

Figure 4A:
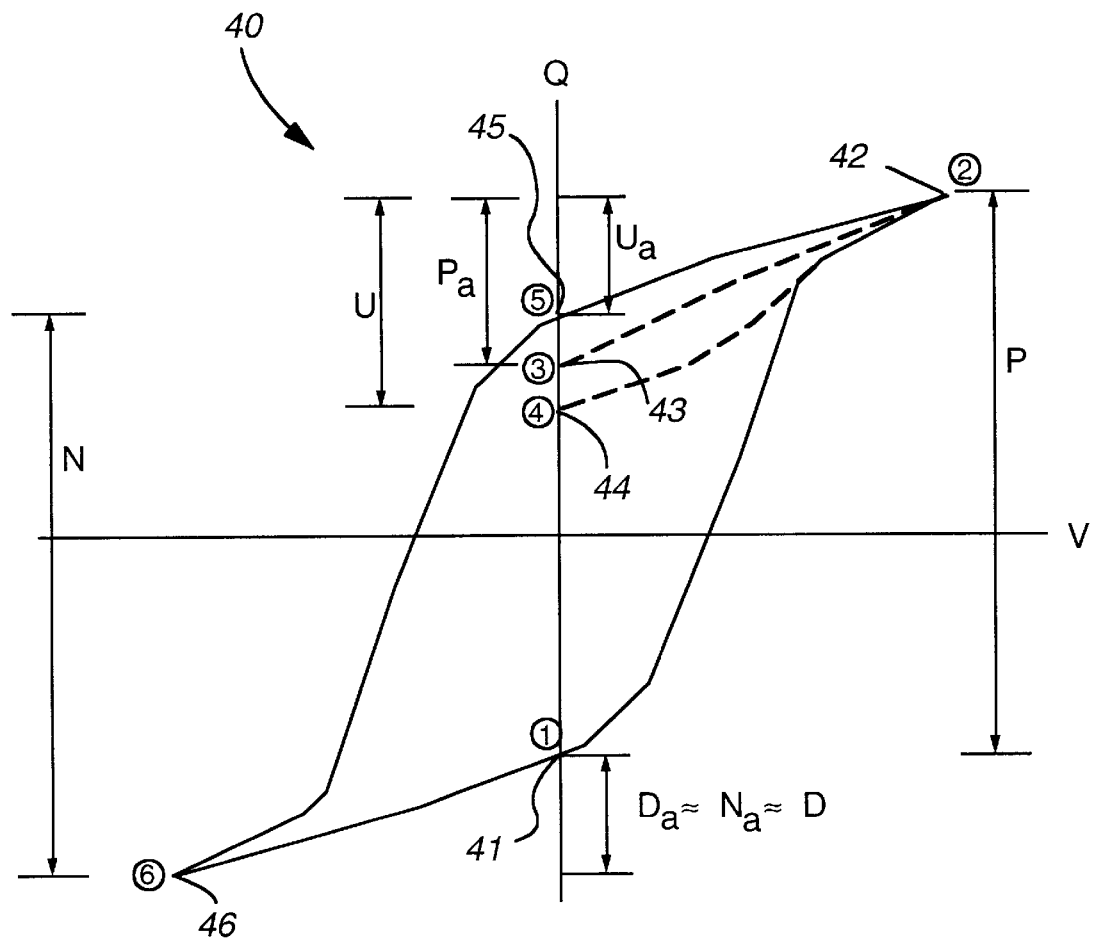
FIGS. 4a and 4b show a hysteresis loop and corresponding voltage pulse waveform for a ferroelectric capacitor.
Figure 4B:
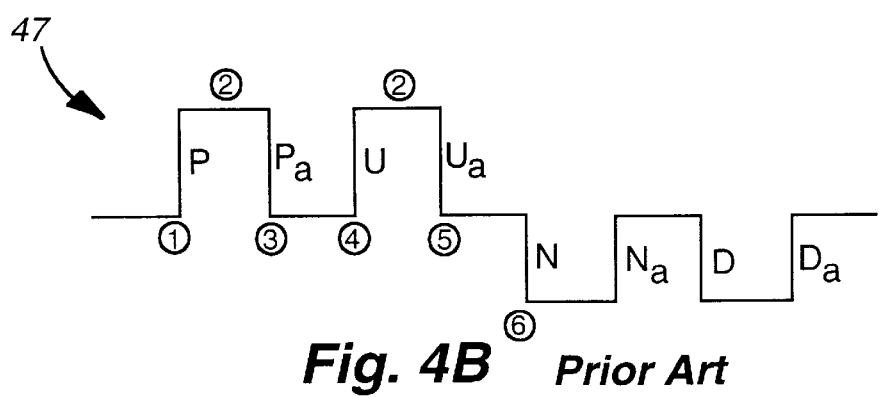
Figure 4C:
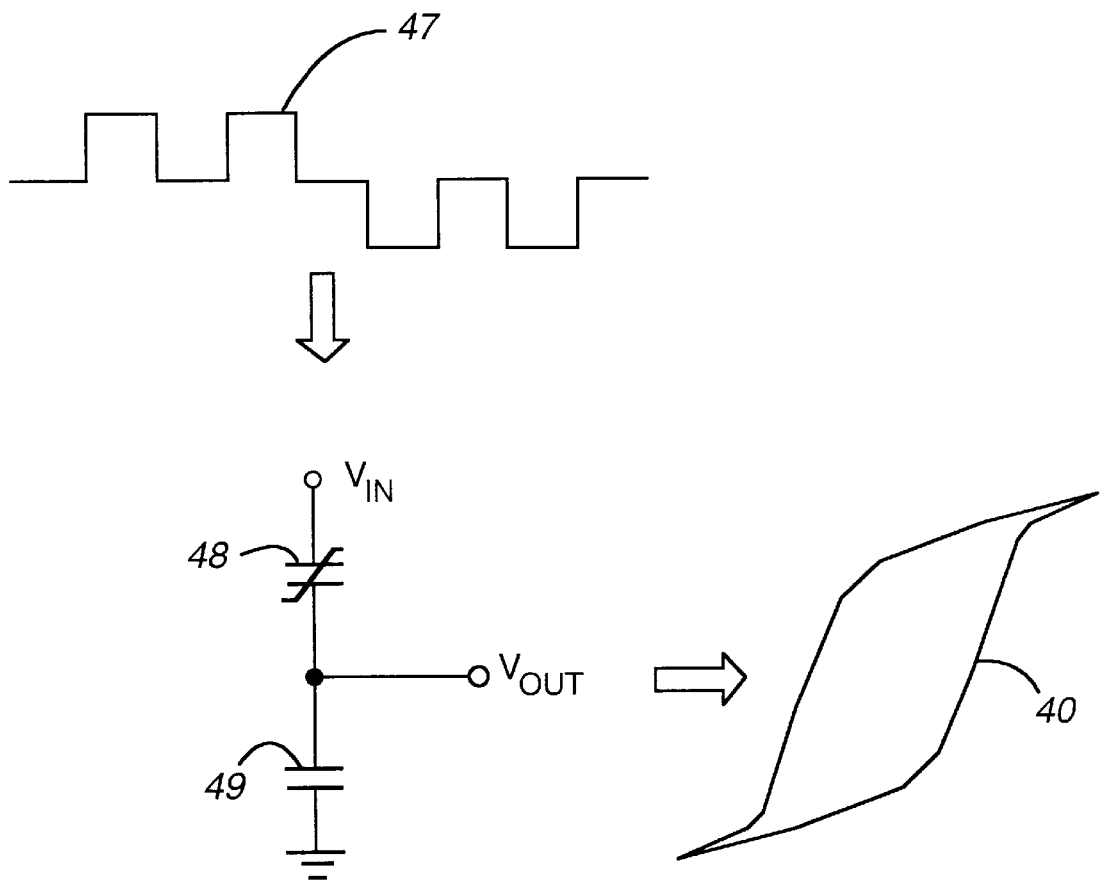
FIG. 4c is a schematic diagram of a Sawyer tower circuit, which has the voltage pulse waveform of FIG. 4b as an input and the hysteresis loop of FIG. 4a as an output.
Figure 5:
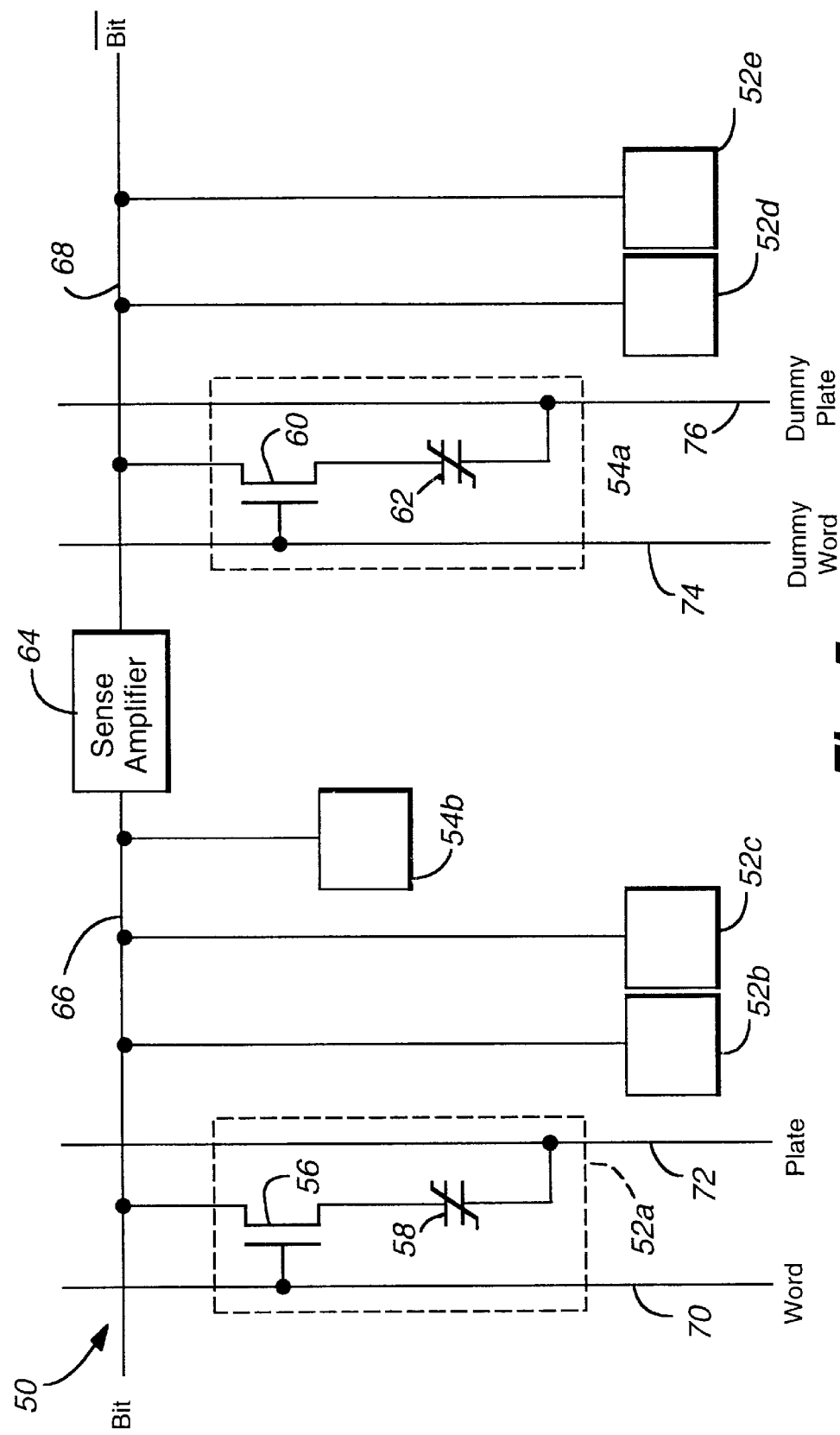
FIG. 5 is a schematic diagram of a prior art 1T-1C ferroelectric memory cell, 1T-1C dummy cell, and array.

The goal of reference cell 90, therefore, is to establish an appropriate midpoint voltage between the two possible data states in a 1T-1C memory cell such as memory cell 82 or 84 used in the non-volatile mode. Referring for a moment back to FIG. 4A, these data states are $P-P_a$ for a logic one and $U-U_a$ for a logic zero. Theoretically, $U-U_a$ is equal to zero, and thus the reference voltage should correspond to a charge of $(P-P_a)/2$. To achieve this, the state of ferroelectric capacitor $CR_0$ is initialized by setting the Ref word line signal and the Refplt control signal to a logic zero, and setting the Refpre control signal to a logic one. Setting the Ref word line signal to zero isolates capacitors $CR_0$ and $CR_1$ from output nodes 95 and 97. The Refset control signal is then pulsed to a logic one and back to a logic zero, which polarizes capacitor $CR_0$ into a down polarization state. It is assumed that the difference between the logic zero and logic one voltages used for establishing a polarization vector on capacitor $CR_0$ is greater than the coercive voltage of the ferroelectric material used. In the case of PZT, a logic zero voltage of ground and a logic one voltage of five volts may be used. That is, a polarization is written into or restored into ferroelectric capacitor $CR_0$ by applying a voltage (e.g. VCC) to the upper plate via the signal Refset and FET 106, while holding the voltage on the lower plate at zero volts via control signal Refplt. Control signal Refpre is then returned to a logic zero. The reference level is established by subsequently turning on the Ref word line signal on node 116 and pulsing the Refplt control signal on node 118 as indicated on FIG. 9 at times t1 through t3, and then turning on the Eq control signal at times t4 through t5. Once this is accomplished, a charge of P-Pa is distributed across bit line load capacitors $CBB_0$ and $CBB_1$, as well as reference cell capacitors $CR_0$ and $CR_1$. The following equations are associated with this condition, wherein Vref is the reference voltage on nodes 95 and 97, $C_{Total}$ is the total capacitance associated with nodes 95 and 97, $C_{Ferro}$ is a standard ferroelectric capacitor value for a memory cell or reference cell, and $C_{Bit}$ is the capacitance associated with a bit line:

$$Vref=(P-P_a)/C_{Total} \quad [1]$$

$$CR_0=CR_1=C_{Ferro} \quad [2]$$

$$CBB_0=CBB1=C_{Bit} \quad [3]$$

$$C_{Total}=CR_0CR_1+CBB_0+CBB_1. \quad [4]$$

Substituting equations [2], [3], and [4] into equation [1] gives:

$$Vref=(P-P_a)/(2*(C_{Ferro}+C_{Bit})) \quad [5]$$

where the symbol "*" denotes multiplication.

An inaccuracy can exist, however, if control signal Eq is turned on before the trailing edge of control signal Refplt. This is due to the dependence of $P-P_a$ upon the applied voltage, which is a function of the bit line capacitance. Since a memory cell divides a charge of P-P$a$ over both the memory cell capacitor and the bit line capacitor, the reference cell 90 should do the same. If control signal Eq is turned on before the trailing edge of the Refplt signal, then $C_{Ferro}$ is divided across both capacitors $CBB_0$ and $CBB_1$, instead of just one, thus producing the inaccuracy.

Figure 9:
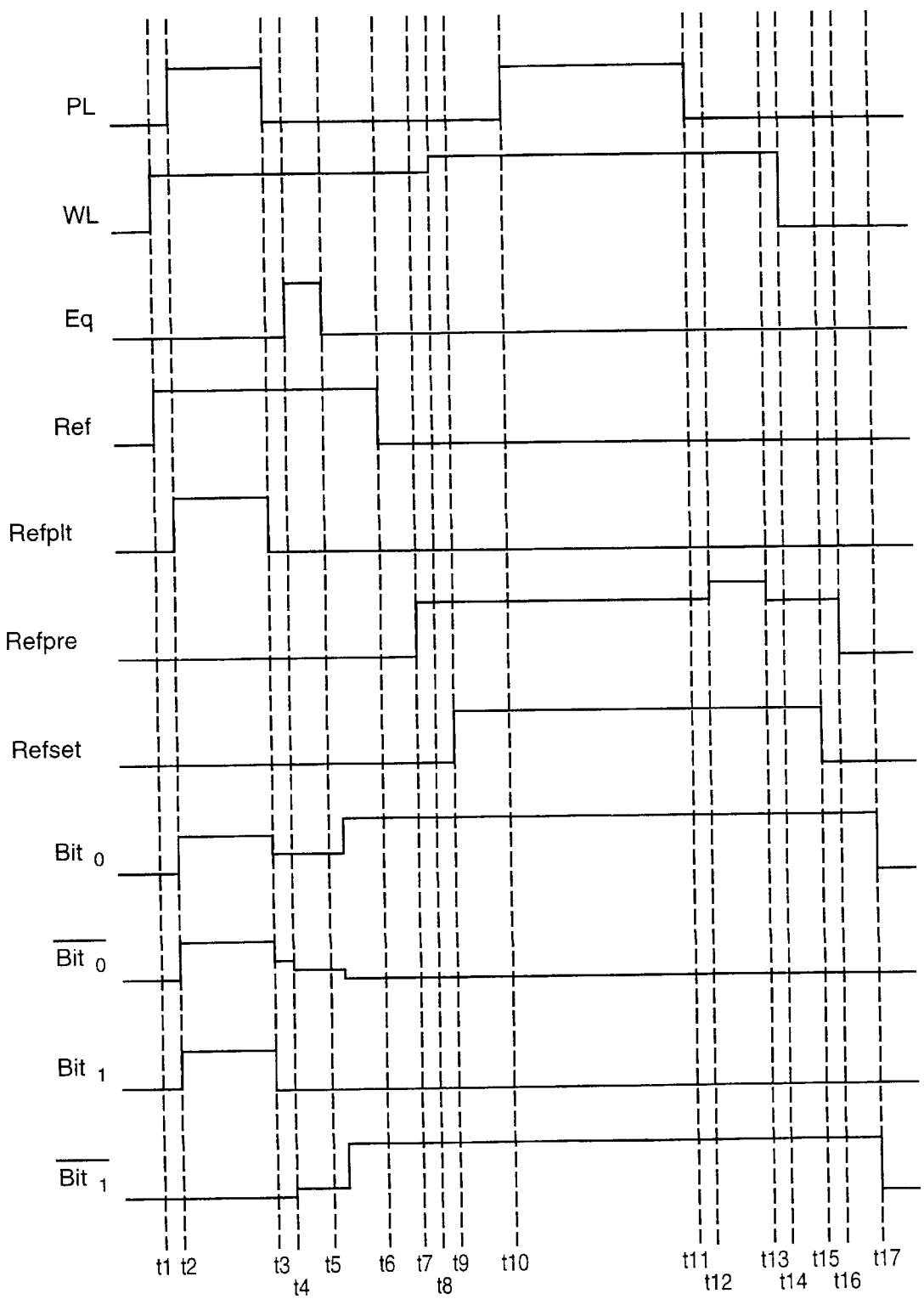
FIGS. 9 and 10 are timing diagrams associated with the reference cell of FIG. 6.

Referring now to the timing diagram of FIG. 9, control signal Eq is properly turned on after the trailing edge of signal Refplt. Reference cell 90 divides a charge of P-Pa with $CBB_0$, the same as memory cell capacitor $CC_0$. Control signal Eq is then set to a logic one after the Refplt signal is set to zero to share the charge level of P-Pa across bit lines 96 and 98 and thus provides the reference voltage shown in equation [5]. After the Eq control signal is returned to a logic zero, sense amplifiers 86 and 88 are latched and bit lines 92 and 94 will either be driven high or low depending on what data state was read out of memory cells 82 and 84. Once bit lines 92 and 94 are latched between times t5 and t6, word line signal Ref is set to a logic zero at time t6, and at time t7 control signal Refpre is set to a logic one. Control signal Refset is then set to a logic one at time t9, while control signal Refplt is at a logic zero after time t3, which restores the polarization to $CR_0$ so it can switch once again in the next cycle. Control signal Refpre is bootstrapped in order to write the full power supply voltage onto capacitor $CR_0$. Control signal Refset then returns to a logic zero at time t15 so that no additional charge remains on capacitor $CR_0$. After control signal Refset returns to a logic zero at time t15, control signal Refpre returns to a logic zero and time t16 and reference cell 90 is ready for the next cycle.

The precise timing diagram for the operation of reference cell 90 in the non-volatile mode is shown in FIG. 9 for the following signals: PL, WL, Eq, Ref, Refplt, Refpre, Refset, $Bit_0$, /$Bit_0$, $Bit_1$, and /$Bit_1$. At some initial time, all signals are at zero volts. The polarization of capacitor $CR_0$ has already been established at times t9 through t17 of the previous cycle. At time t1, the WL and Ref signals are pulsed to a logic one, addressing a row of memory cells and coupling ferroelectric capacitors $CR_0$ and $CR_1$ to nodes 95 and 97. At time t2, the PL and Refplt signals are pulsed to a logic one, which moves charge on to the bit lines. At time t3, the PL and Refplt pulses are returned to a logic zero. At time t4, the Eq signal is asserted, and between times t4 and t5 charge is equally distributed on bit lines 96 and 98. At time t5, the Eq signal is returned to a logic zero and sense amplifiers 86 and 88 are latched, which results in full logic levels on all bit lines. At time t6 the Ref signal is returned to a logic zero, which isolates capacitors $CR_0$ and $CR_1$ from bit lines 96 and 98. At time t7, signal Refpre is asserted, energizing the gate of transistors 106 and 108. Shortly thereafter, at time t8 the WL signal for memory cells 82 and 84 is bootstrapped to a voltage higher than the power supply voltage so that the memory cells can be written to the full logic levels. At time t9, the Refset signal is asserted, which restores the prior polarization vector to capacitor $CR_0$. At time t10, the PL signal is pulsed, which restores the polarization in the memory cell capacitors. At time t11, the PL signal is returned to a logic zero. At time t12, the Refpre signal is bootstrapped to a voltage higher than the power supply voltage of VCC so that capacitor $CR_0$ is fully polarized. At time t13, the bootstrap voltage is removed, and at time t14 the WL signal is turned off, deselecting memory cells 82 and 84. At times t15, and t16, the Refset and Refpre signals are returned to a logic zero, and time t17 sense amplifiers 86 and 88 are returned to a logic zero, returning all bit lines to the initial zero volt condition. It should be noted that the particular timing sequence shown in FIG. 9 can be modified by those skilled in the art while maintaining the same voltage reference value at reference nodes 95 and 97.

With regard to ferroelectric capacitor $CR_1$, when Eq is at a logic one and Ref is at a logic one, the upper plates of capacitors $CR_0$ and $CR_1$ are coupled together via the source-drain paths of transistors 100, 102 and 104. From FIG. 9 it can be seen that this condition subsists from time t5 to t6. During this interval, Refpre is at a logic zero, so FET 108 is off. Hence a polarization is established on capacitor $CR_1$, since its bottom plate is connected to ground. The direction of the polarization is never changed on capacitor $CR_1$.

Dynamic Mode of Reference Cell 90

In general, the dynamic mode of reference cell 90 includes the following steps: establishing a charge on capacitor $CR_0$ (instead of a polarization vector as in the non-volatile mode), coupling the reference cell capacitors $CR_0$ and $CR_1$ to the respective bit lines 96 and 98, and finally distributing the charge on capacitor $CR_0$ between reference cell capacitors $CR_0$ and $CR_1$ to create a reference voltage that is impressed on both bit lines 96 and 98.

Figure 10:
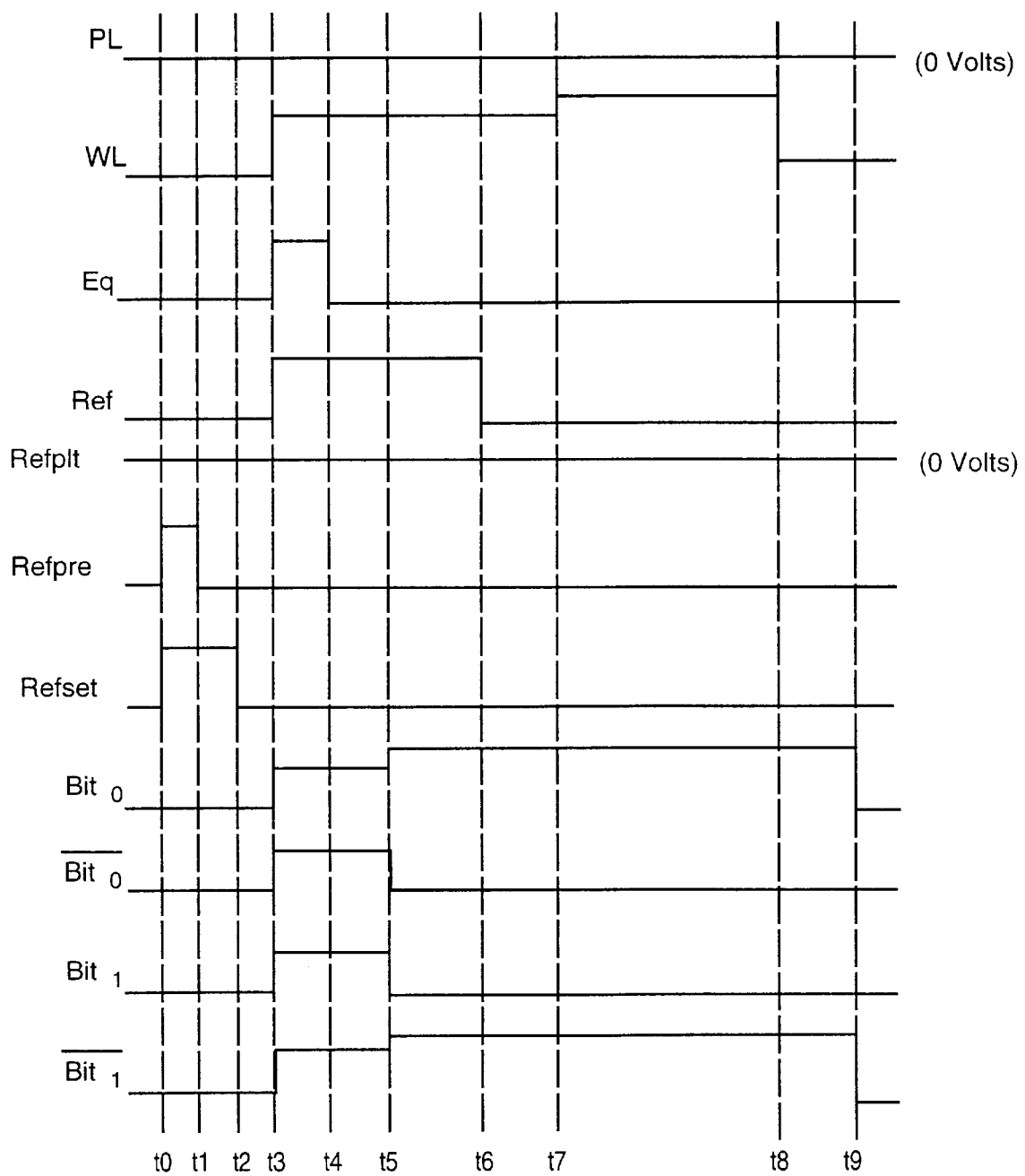

The goal of reference cell 90 is to establish a midpoint level between the two possible data states in a 1T-1C memory cell such as memory cell 82 or 84 used in the dynamic mode. FIG. 10 is a timing diagram that illustrates the preferred mode of operation for providing a reference for dynamic memory cells, i.e. memory cells in which the capacitive element is used to store charge (the linear mode) and not a polarization vector. Referring momentarily to FIG. 4A, the charge available for a capacitor used in the linear mode is $D_a$ between points 41 and 46. The corresponding midpoint charge for reference cell 90 is thus $D_a/2$. In general, this is accomplished by writing the full power supply voltage onto capacitor $CR_0$, ending up at point 46, and allowing this charge to be shared with capacitor $CR_1$ and bit lines 96 and 98. The down polarization state of capacitor $CR_1$ is first established when data is first written into the memory array and it is never changed. Since the Da charge is based upon the linear operation of the capacitor dielectric in which there is no switching of the polarization vector, the Eq and Ref signals can be turned on simultaneously. The resultant reference voltage on each of nodes 95 and 97 is thus:

$$Vref = D_a / C_{Total} \qquad [6]$$

$$Vref = D_a / (2*(C_{Ferro} + C_{Bit})) \qquad [7]$$

The precise timing diagram for the operation of reference cell 90 in the dynamic mode is shown in FIG. 10 for the following signals: PL, WL, Eq, Ref, Refplt, Refpre, Refset, $Bit_0$, $/Bit_0$, $Bit_1$, and $/Bit_1$. Note that in FIG. 10, the PL and Refplt signals are forced to ground potential. This is because both the memory cells 82 and 84, as well as reference cell 90 are operated in a dynamic mode. That is, the ferroelectric capacitors are used in a linear portion of the hysteresis curve and operate as conventional capacitors between points 41 and 46 on hysteresis curve 40. The polarization state of the ferroelectric capacitors is not changed. At some initial time before time $t_0$, all signals are at zero volts. At time t0 the Refpre and Refset signals, are asserted. The Refset signal is driven to a power supply voltage of about five volts, whereas the Refpre signal is driven to a bootstrapped voltage level that is slightly greater than the power supply voltage. With Refplt at zero volts, a level of five volts is thus established across capacitor $CR_0$, with the polarization vector pointing down. At time t1, the Refpre signal is returned to a logic zero, turning off transistors 106 and 108. At time t2, the Refset signal is negatively pulsed to a logic zero. At time t3, the WL, Eq, and Ref signals are taken high, thus addressing memory cells 82 and 84, and reference cell 90. In reference cell 90, charge is shared between capacitors $CR_0$ and $CH_1$, and capacitors $CR_0$ and $CR_1$ are coupled to nodes 95 and 97 to establish equal reference voltages. Referring momentarily to FIG. 4A recall that the total charge component available is $D_a$ (the linear component exercised over five volts), and therefore the charge component at each of nodes 95 and 97 is $D_a/2$. The resultant voltage is substantially half of that produced by a logic one in a memory cell. The Eq signal is left on for a short time in order that the charge be completely equalized between capacitors $CR_0$ and $CR_1$. At time t4, the Eq signal is returned to a logic zero. At time t5, with the Eq signal at a logic zero, sense amplifiers 86 and 88 are latched, which results in full logic levels on all bit lines. At time t6 the Ref signal is turned off, which isolates capacitors $CR_0$ and $CR_1$ from bit lines 96 and 98. At time t7 the WL signal for memory cells 82 and 84 is bootstrapped to a voltage higher than the power supply voltage so that the full logic levels can be written to the memory cells. At no time does the polarization vector of capacitor $CR_0$ change direction. At time t8, the bootstrap voltage is removed, and the WL signal is returned to a logic zero, deselecting memory cells 82 and 84. At time t9, all signals are returned to initial conditions and reference cell 90 is ready for another cycle.

Figure 11:
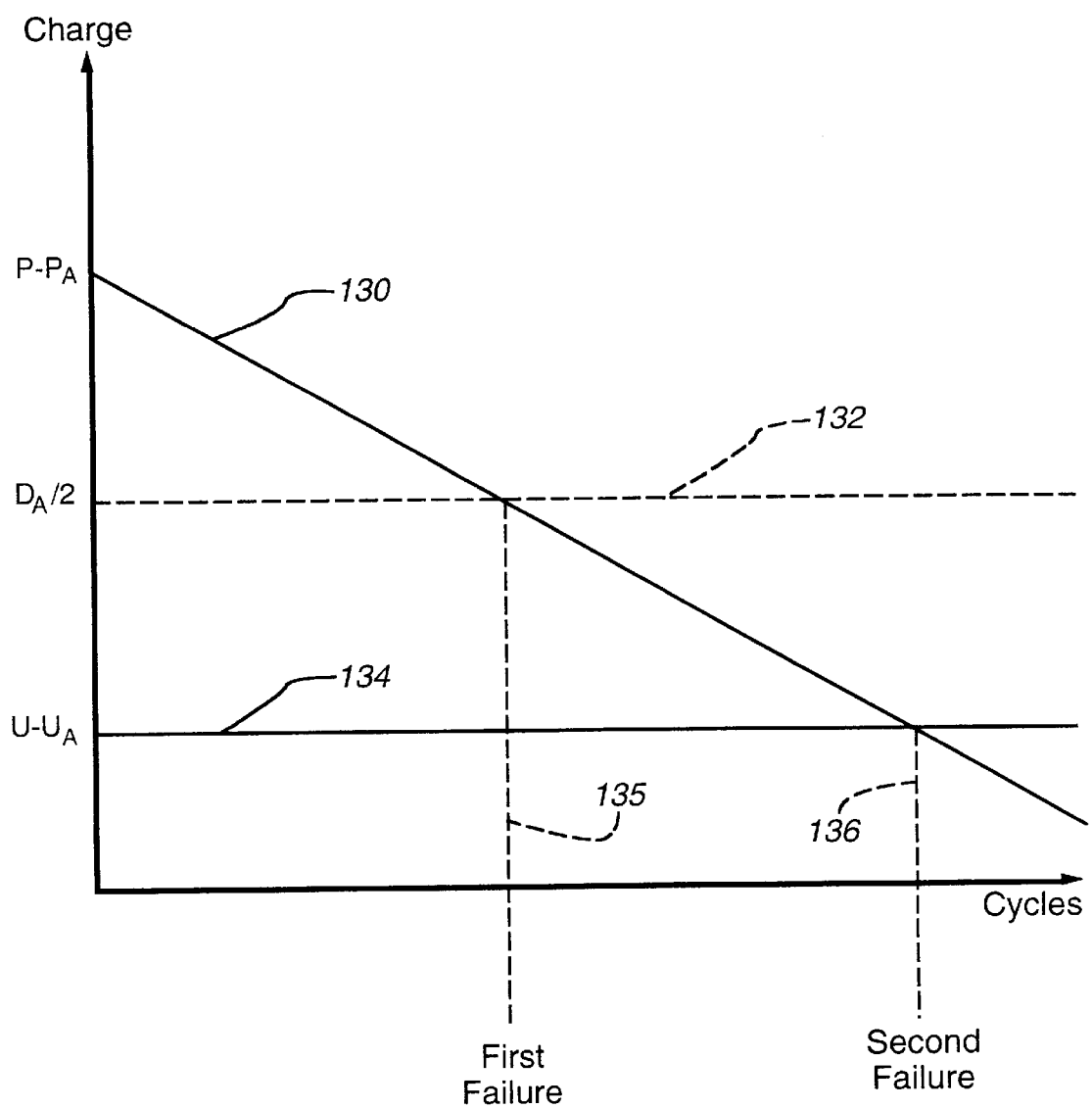
FIG. 11 is a plot of charge versus operating cycles for a ferroelectric capacitor illustrating fatigue.

Turning now to FIG. 11, the mechanism of fatigue of a ferroelectric capacitor is illustrated. The graph in FIG. 11 has units of charge along the y-axis and units of cycles along the x-axis, wherein each cycle represents a change in polarization vector of a ferroelectric capacitor. In FIG. 11, the P-$P_a$ (switched charge) component 130 and U-$U_a$ (non-switched charge) component 134 are graphed versus the number of switching cycles. These charge levels generally represent a logic one and a logic zero level in a ferroelectric memory cell. Also, a $D_a/2$ midpoint reference level 132 is graphed to show the relationship between the three levels. During the first few switching cycles, there is an ideal relationship between the levels. The P-$P_a$ level is considerably higher than the U-$U_a$ level, with the $D_a/2$ reference level 132 substantially halfway between the two. As the number of cycles increases, note that the P-$P_a$ switched charge level decreases. As the switched charge level decreases, it becomes increasingly hard for a sense amplifier to resolve the two states. As the P-$P_a$ switched charge level crosses reference level 132, it is impossible to resolve the two states with the given reference level. A first failure mechanism thus occurs at the number of cycles represented by vertical line 135. As the P-Pa switched charge level crosses the U-Ua non-switched charge level 134, it is impossible even to construct a reference so that the two logic levels are resolved, resulting in a second failure mechanism of the memory cell at the number of cycles represented by vertical line 136.

Non-Fatiguing Reference Cell 142

Figure 12:
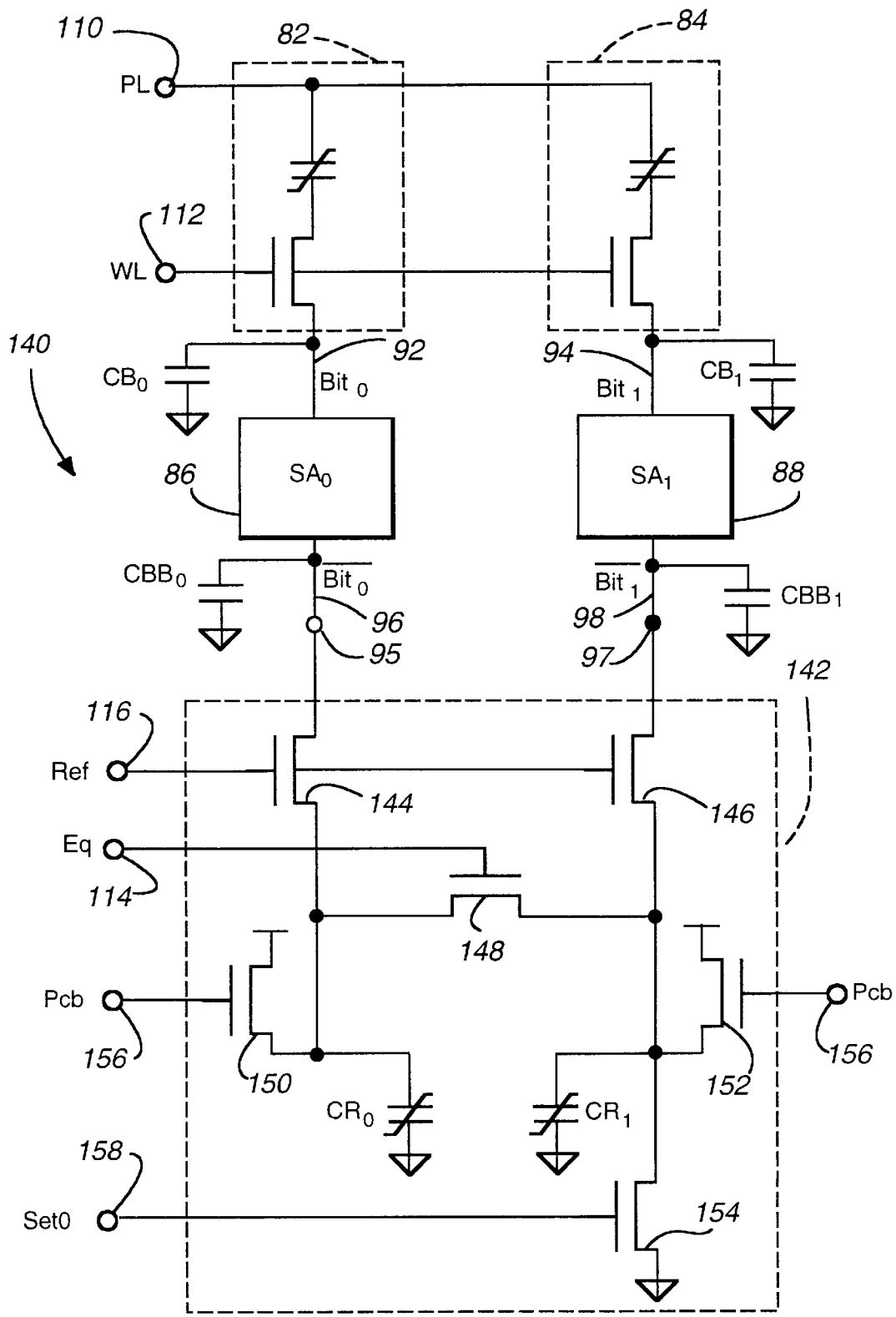
FIG. 12 is a schematic diagram of a second embodiment of a ferroelectric reference cell according to the present invention.

A second embodiment of a reference cell 142 for use in a ferroelectric memory including an array of 1T-1C memory cells is shown in FIG. 12. FIG. 12 is incomplete, in that it only shows one reference cell, whereas an actual memory array would have one reference cell for each pair of bit lines 92, 94 as well as bit lines 96, 98. Reference cell 142, unlike reference cell 90 used in the non-volatile mode, does not exhibit the fatigue failure shown in FIG. 11 because the polarization vector of the ferroelectric capacitors in the cell is never switched. In addition to reference cell 142, a portion of an array 140 is shown including two representative 1T-1C memory cells 82 and 84, as well as sense amplifiers 86 and 88 labeled $SA_0$ and $SA_1$. Memory cells 82 and 84 are coupled to a common plate line 110 labeled PL, a common word line 112 labeled WL, and to bit lines 92 and 94. Reference cell 142 can be used in either the open or folded memory architectures as shown in FIGS. 6 and 7. Also shown in FIG. 12 are bit lines 92 and 94 labeled $Bit_0$ and $Bit_1$, with corresponding bit line capacitance loads $CB_0$ and $CB_1$, as well as complementary bit lines 96 and 98 labeled $/Bit_0$ and $/Bit_1$, with corresponding bit line capacitance loads $CBB_0$ and $CBB_1$.

Reference cell 142 includes first and second voltage reference outputs 95 and 97 coupled to respective bit lines 96 and 98 and first and second ferroelectric capacitors $CR_0$ and $CR_1$. The capacitance value of each of ferroelectric capacitors $CR_0$ and $CR_1$ is equal to the capacitance value of a memory cell capacitor in memory cells 82 and 84, as well as all other memory cell transistors in the array. Transistors 144 and 146 selectively couple one end (i.e. plate electrode) of ferroelectric capacitors $CR_0$ and $CR_1$ to the first and second voltage reference outputs 95 and 97. The gates of transistors 144 and 146 are coupled to node 116 for receiving a Ref control signal. In reference cell 142, the other plate electrodes of capacitors $CR_0$ and $CR_1$ are coupled directly to ground. Transistors 150 and 152 selectively couple a source of supply voltage to the first-mentioned plate electrodes of capacitors $CR_0$ and $CR_1$, respectively. These may be called the "top" plate electrodes but it should be understood that a reference in this specification to a "top" or "bottom" plate electrode is with reference to the schematic diagram. The actual (physical) electrodes may not be as specified. The gates of the transistors are coupled to node 156 for receiving a Pcb control signal. Transistors 150 and 152 are shown as N-channel FETs in FIG. 12, but P-channel FETs may be substituted, in which case the polarity of the Pcb control signal is reversed. A transistor 154 is coupled between the top plate electrode of capacitor $CR_1$ and ground, its gate being coupled to node 158 for receiving a Set0 control signal. A transistor 148 is coupled between capacitors $CR_0$ and $CR_1$. The gate of transistor 148 is coupled to node 114 for receiving an Eq control signal.

In general, the method of operation of dual output reference cell 142 includes the following steps: writing a voltage to both ferroelectric capacitors $CR_0$ and $CR_1$ such that the direction of the polarization vector of those ferroelectric capacitors is never changed; removing the developed charge from only one of those capacitors; equally distributing the removed charge across both of the ferroelectric capacitors; and coupling ferroelectric capacitors $CR_0$ and $CR_1$ to the first and second voltage reference outputs 95, 97 to create a substantially equal reference voltage on both of the voltage reference outputs. The reference voltage generated by reference cell 142 is substantially half of the voltage generated by a memory cell when read in either a dynamic or a non-volatile mode. Note that all bit line and cell capacitances in FIG. 12 are precisely balanced between the reference cell 142 and the memory cells 82 and 84.

Figure 13:
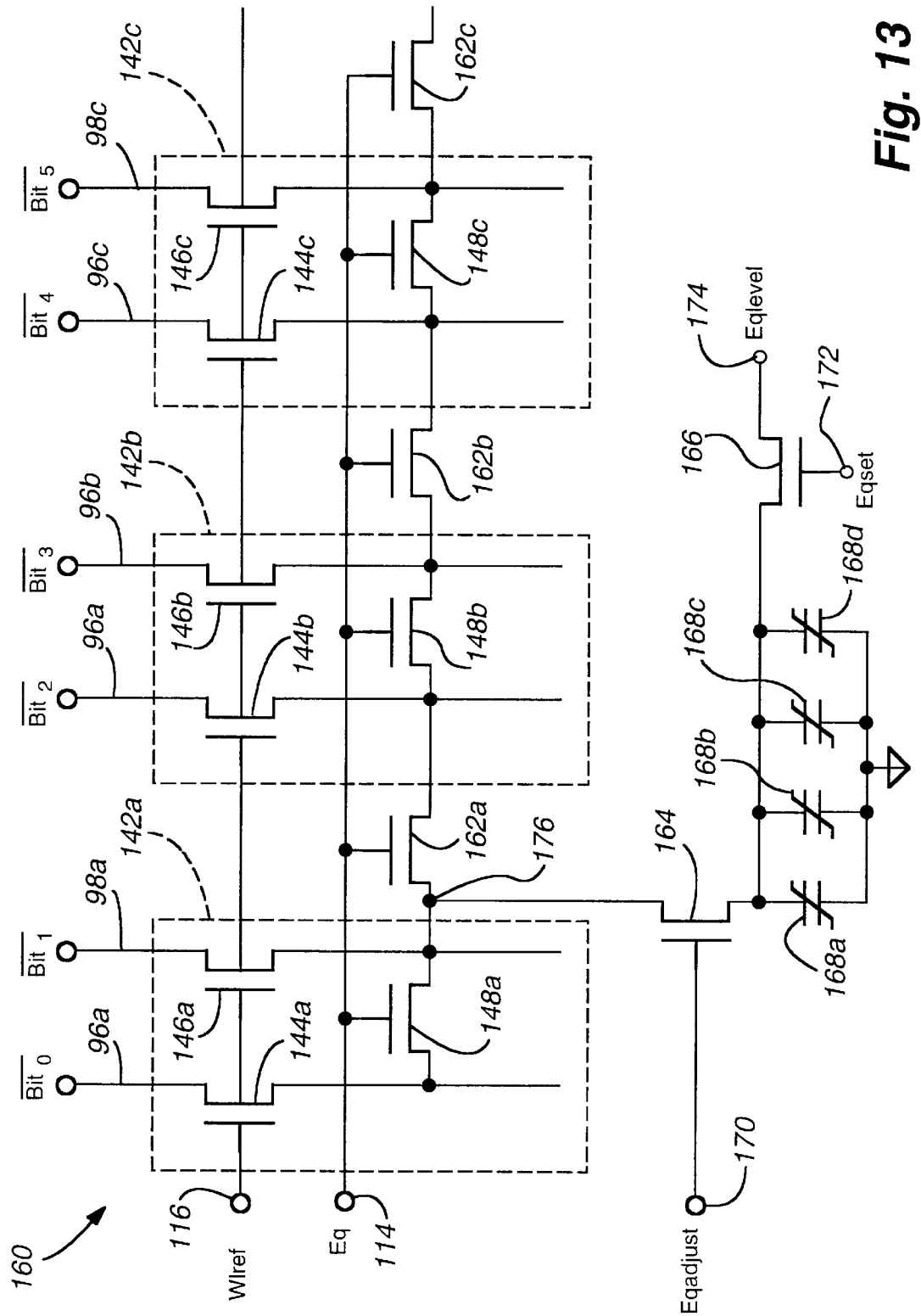
FIG. 13 is a schematic diagram of a portion of a memory array in which multiple reference cells of FIG. 12 are shown.

A circuit for precisely adjusting the reference voltages is shown in FIG. 13. Array portion 160 includes three representative reference cells 142a, 142b, and 142c as shown. All reference cells are configured as in FIG. 12 and are coupled to corresponding bit lines 96a/98a, 96b/98b, and 96c/98c. Only a portion of each reference cell 142a–c is shown in FIG. 13. Each reference cell 142a–c is coupled together with an additional transistor. Note that cells 142a and 142b are selectively coupled together with transistor 162a, and that cells 142b and 142c are selectively coupled together with transistor 162b. The gates of transistors 142a–c and transistors 162a–c are all coupled together and to node 114 for receiving the Eq control signal. In this way, the charge between all of the cells is equally distributed to maintain equal reference voltages on all bit lines. Further, the amount of charge can be adjusted up or down with the circuit including transistors 164 and 166, as well as capacitors 168a through 168d. The drain of transistor 164 is coupled to node 176 and the gate of transistor 164 is coupled to node 170 to receive an Eqadjust control signal. The source of transistor 164 is coupled to the first plate electrodes of ferroelectric capacitors 168a through 168d, the second plate electrodes of the capacitors being coupled to ground. Transistor 166 is coupled between capacitors 168a–d and node 174, which receives an Eqlevel control signal. The gate of transistor 166 is coupled to node 172 to receive the Eqset control signal.

In operation, the capacitance value of each of capacitors 168a–d is equal to the capacitance value of the capacitors in either the reference cell 142 or memory cell 82 or 84. Only four capacitors are shown, but any number can be used as desired for a particular application. The Eqlevel signal is either five volts or ground, and is used to write these voltages onto capacitors 168a–168d. If five volts is used, the equivalent charge is developed on the capacitors in conjunction with signals Eqset and delivered to node 176 via transistor 164, which is turned on by the Eqadjust signal. The additional charge will be added to the common shared charge by an amount determined by the number of reference cells 142 in the array and the number of capacitors 168 in the adjustment circuitry. The corresponding reference voltage on all bit lines is thus increased. Conversely, a zero voltage written to capacitors 168a–168d serves to subtract an amount of charge determined by the number of reference cells 142 and capacitors 168. The corresponding reference voltage on all bit lines in thus decreased.

Figure 14:
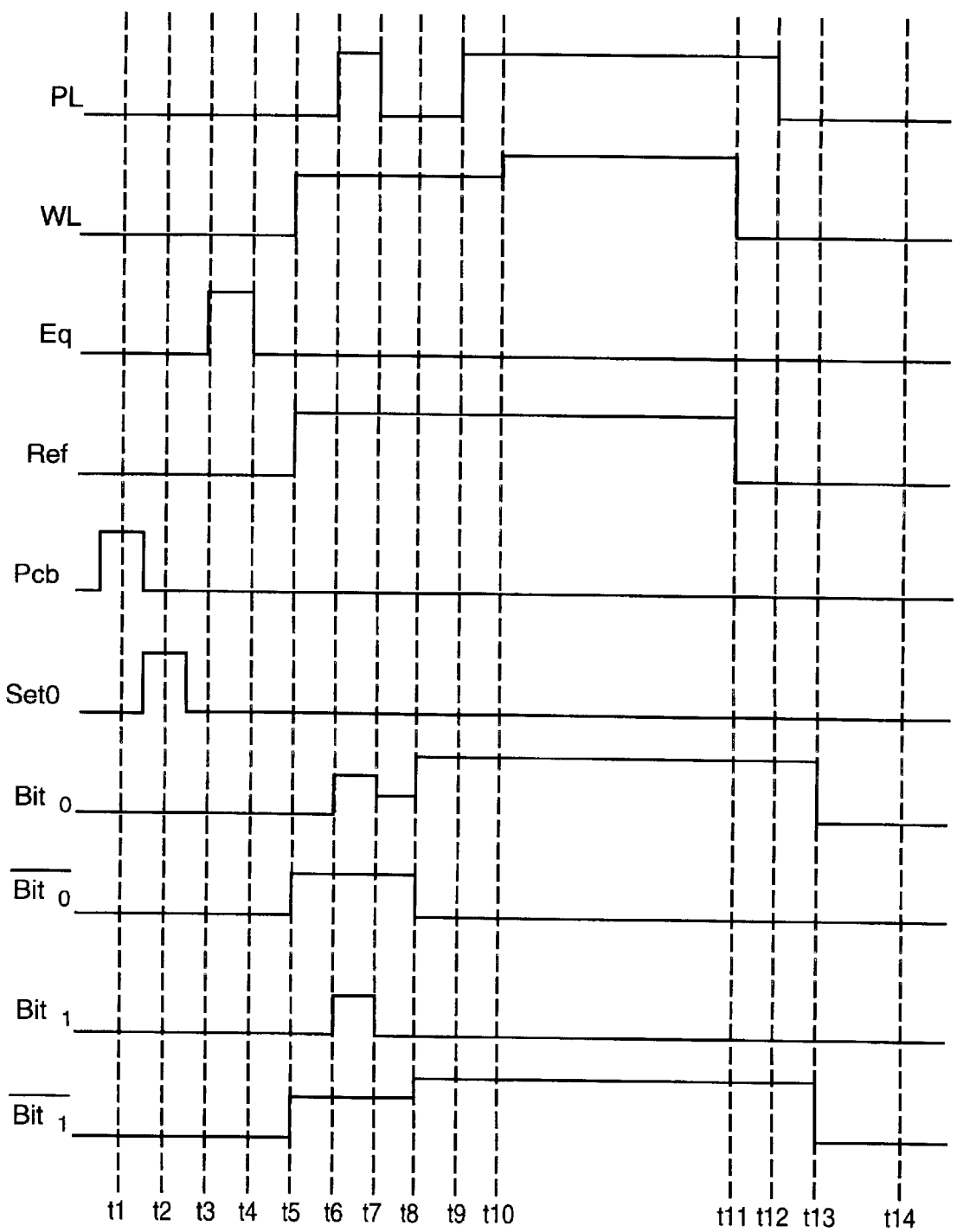
FIG. 14 is a timing diagram associated with the reference cell of FIG. 12.

The precise timing diagram for the operation of reference cell 142 in both the dynamic and non-volatile modes is shown in FIG. 14 for the following signals: PL, WL, Eq, Ref, Pcb, Set0, $Bit_0$, $/Bit_0$, $Bit_1$, and $/Bit_1$. At some initial time, all signals are at zero volts. Centered at time t1, the Pcb signal is pulsed, forcing five volts to be written onto capacitors $CR_0$ and $CR_1$ by transistors 150 and 152. Ideally, the Pcb signal should be bootstrapped to a level greater than the power supply voltage so that the full power supply voltage is written into capacitors $CR_0$ and $CR_1$. The Set0 pulse, centered at time t2, removes the charge from capacitor $CR_1$. It is important that the Pcb pulse be returned to ground before the Set0 pulse is asserted. At time t3, the Eq pulse is turned on, causing charge to be shared between capacitors $CR_0$ and $CR_1$. Note that at this time, capacitors $CR_0$ and $CR_1$ are not yet coupled to nodes 95 and 97. At time t4, the Eq pulse is turned off. At time t5, the WL and Ref signals are turned on, selecting memory cells 82 and 84, and coupling capacitors $CR_0$ and $CR_1$ to bit lines 96 and 98. At time t6, the PL signal is turned on, forcing charge from the memory cells onto bit lines 92 and 94. Shortly thereafter, at time t7, the PL signal is turned off. At time t8, the sense amplifiers are latched, establishing full logic levels on all bit lines. At time t9, the PL signal is again taken high, and at time t10, the WL signal is bootstrapped, thus restoring the original memory states to memory cells 82 and 84. At times T11 and t12, the WL and PL signals are turned off, deselecting memory cells 82 and 84. At time t13, the sense amplifiers are turned off. At time t14, all signals have been returned to initial conditions and reference cell 142 is ready for another cycle.

Having described and illustrated the principles of the invention in a preferred embodiment thereof, it is appreciated by those having skill in the art that the invention can be modified in arrangement and detail without departing from such principles. We therefore claim all modifications and variation coming within the spirit and scope of the following claims.

We claim:

1. A reference cell for use in a ferroelectric memory including an array of 1T-1C memory cells, the reference cell comprising:

first and second voltage reference outputs each coupled to a corresponding bit line;

first and second ferroelectric capacitors;

first and second transistors each having a current path for coupling a first end of the first and second ferroelectric capacitors to the first and second voltage reference outputs, each transistor further including a control node for receiving a first control signal, wherein a second end of the first capacitor receives a second control signal and a second end of the second capacitor is coupled to ground;

a third transistor having a current path coupled between the first end of the first capacitor and a source of a third control signal, the third transistor having a control node for receiving a fourth control signal;

a fourth transistor having a current path coupled between the first end of the second capacitor and ground, the fourth transistor having a control node for receiving the fourth control signal; and a fifth transistor having a current path coupled between the reference outputs and a control node for receiving a fifth control signal.

2. A reference cell for use in a ferroelectric memory including an array of 1T-1C memory cells, the reference cell comprising:

first and second voltage reference outputs each coupled to a bit line;

first and second ferroelectric capacitors;

first and second transistors each having a current path for coupling a first end of the first and second ferroelectric capacitors to the first and second voltage reference outputs, each transistor further including a control node for receiving a first control signal, wherein a second end of the first capacitor and second capacitors is coupled to ground;

fourth and fifth transistors each having a current path coupled between a source of supply voltage and the first end of the first and second ferroelectric capacitors, respectively, each transistor further including a control node for receiving a second control signal;

a fifth transistor having a current path coupled between the first end of one of the ferroelectric capacitors and ground, the transistor having a control node for receiving a third control signal; and a sixth transistor having a current path coupled between first ends of the ferroelectric capacitors and a control node for receiving a fourth control signal.

3. A ferroelectric memory comprising:

an array of 1T-1C ferroelectric memory cells arranged in rows and columns, each row of memory cells having an associated bit line;

a column of ferroelectric reference cells each having two outputs for providing substantially equal reference voltages, wherein the two outputs are coupled to a pair of bit lines.

4. A ferroelectric memory as in claim 3 in which the array is configured in an open memory architecture.

5. A ferroelectric memory as in claim 3 in which the array is configured in a folded memory architecture.

6. A ferroelectric memory as in claim 3 in which the reference cell includes two ferroelectric capacitors each having a value equal to the value of a ferroelectric capacitor in one of the memory cells.

7. A ferroelectric memory as in claim 6 in which the reference cell further comprises:

means for establishing a charge on one of the ferroelectric capacitors; and means for sharing the charge between the two ferroelectric capacitors to establish the two substantially equal reference voltages.

8. A ferroelectric memory as in claim 3 in which a load capacitance associated with each of the memory cell bit lines is substantially equal to a load capacitance associated with each of the reference cell bit lines.

* * * * *